United States Patent [19]

Iijima et al.

[11] Patent Number: 5,529,954
[45] Date of Patent: Jun. 25, 1996

[54] METHOD OF DIFFUSING A METAL THROUGH A SILVER ELECTRODE TO FORM A PROTECTIVE FILM ON THE SURFACE OF THE ELECTRODE

[75] Inventors: Tadashi Iijima; Hisako Ono; Yukihiro Ushiku, all of Yokohama, Japan; Akira Nishiyama, Amsterdam, Netherlands; Naomi Nakasa, Nagano-ken, Japan

[73] Assignee: Kabushiki Kaisha Toshiba, Kawasaki, Japan

[21] Appl. No.: 480,733

[22] Filed: Jun. 7, 1995

Related U.S. Application Data

[63] Continuation of Ser. No. 177,552, Jan. 5, 1994, abandoned.

[30]   Foreign Application Priority Data

Jan. 5, 1993 [JP] Japan ..................................... 5-015914
May 13, 1993 [JP] Japan ..................................... 5-135398

[51] Int. Cl.$^6$ ..................................... H01L 21/28
[52] U.S. Cl. .......................... 437/189; 437/192; 437/954; 148/DIG. 15; 148/DIG. 35
[58] Field of Search .................... 148/DIG. 35, DIG. 15; 437/954, 189, 192, 190, 201; 257/762

[56]   References Cited

U.S. PATENT DOCUMENTS

| | | |
|---|---|---|
| 4,320,169 | 3/1982 | Yatabe et al. . |
| 4,774,204 | 9/1988 | Havemann . |
| 4,806,818 | 2/1989 | van Esdonk et al. . |
| 5,047,367 | 9/1991 | Wei et al. . |
| 5,057,763 | 12/1991 | Spitzer et al. . |
| 5,084,412 | 1/1993 | Nakashaki . |
| 5,277,985 | 1/1994 | Li et al. . |
| 5,356,837 | 10/1994 | Geiss et al. ............................. 437/200 |
| 5,457,069 | 10/1995 | Chen et al. ............................. 437/201 |

FOREIGN PATENT DOCUMENTS

| | | |
|---|---|---|
| 1-227456 | 9/1989 | Japan . |
| 3-119727 | 5/1991 | Japan . |

OTHER PUBLICATIONS

Vou Seefeld et al, IEEE Trans. on Electron Dev., vol. ED–27, #4, 1980.
Cheung, N. W., et al., J. Appl. Phys, 52 (6) 1991, p. 4297.
Hirasaka, M., et al., Solar energy Materials 19 (1989) 199.
Becker, W. H., Dissertation, U. Penn., (Abstract).
Y. Ushiku, et al. "Planarized Silver . . . " in Proc. Symp. VLSI Tech., 1993, pp. 121–122.
T. Iijima, et al. "Analysis of Ti . . . ". Ext. Abst of the 1993 Int'l Conf. on SSDM, pp. 183–185.
K. Hoshino, et al. "TiN–Encapsulized . . . ". Jun. 12–13, 1989 VMIC Conference, pp. 226–232.
J. Wada, et al. "Formulation Of Single . . . " in Proc. of Symp. on Dry Process., 1992, pp. 175–180.
J. Wada, et al. "New Method Of Making . . . " in IEEE. IRPS, 1993, pp. 71–76.

*Primary Examiner*—Tom Thomas
*Assistant Examiner*—Leon Radomsky
*Attorney, Agent, or Firm*—Oblon, Spivak, McClelland, Maier & Neustadt

[57]   ABSTRACT

A semiconductor device includes a first metal film formed on a semiconductor substrate, a second metal film formed on the first metal film and containing silver as a main component, and a protective film containing a metal element of the first metal film and covering at least the upper surface of the second metal film. The protective film is formed by annealing in an atmosphere containing a predetermined element. That is, the metal element of the first metal film is diffused into the second metal film and reacts with the predetermined element in the atmosphere on the surface of the second metal film, thereby forming the protective film. Aggregation of silver is prevented in the presence of the protective film.

5 Claims, 18 Drawing Sheets

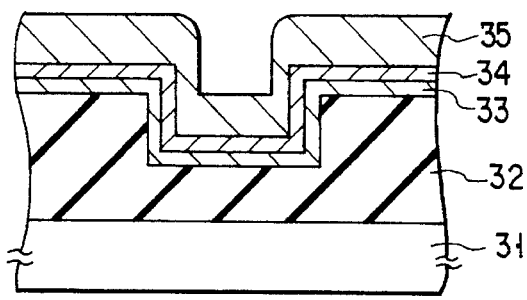
F I G. 5A
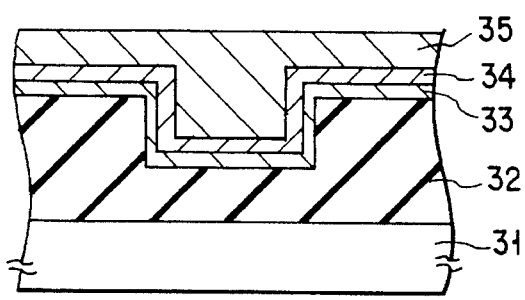
F I G. 5B
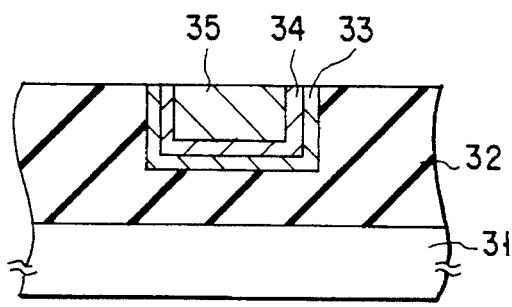
F I G. 5C
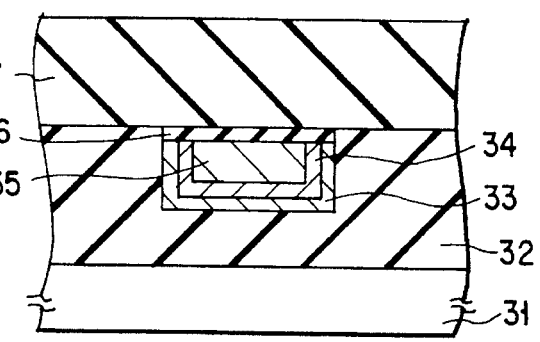
F I G. 5D

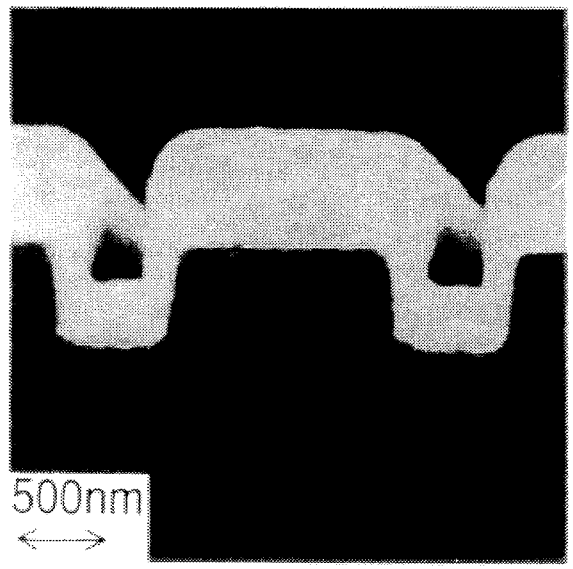
F I G. 6
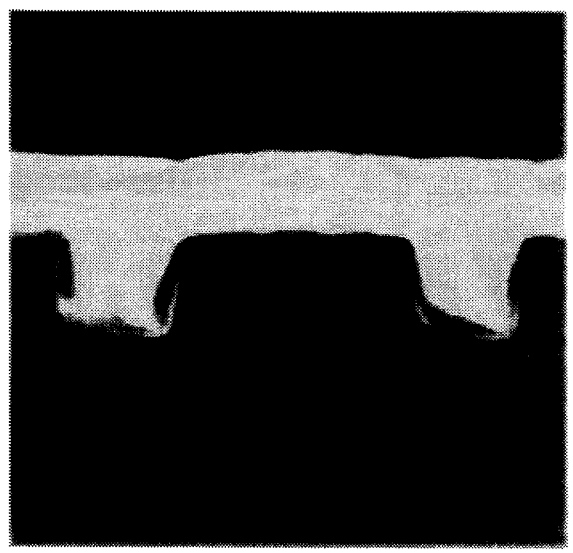
F I G. 7
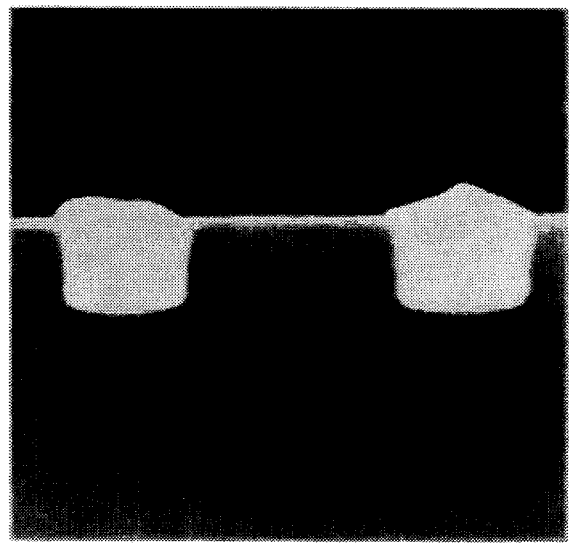
F I G. 8

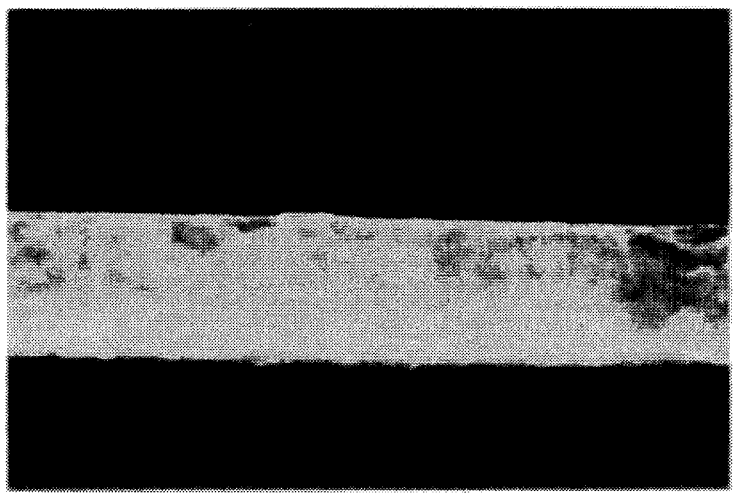
F I G. 9A
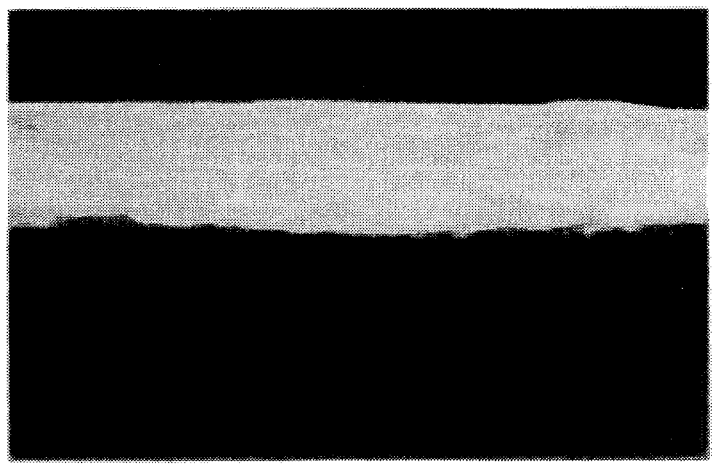
F I G. 9B
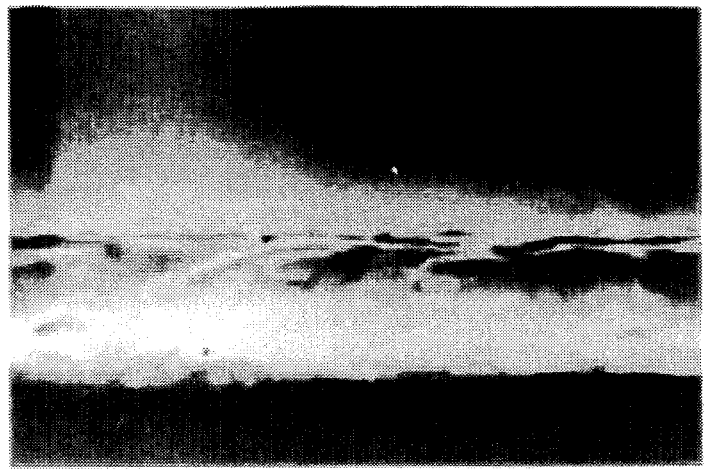
F I G. 9C

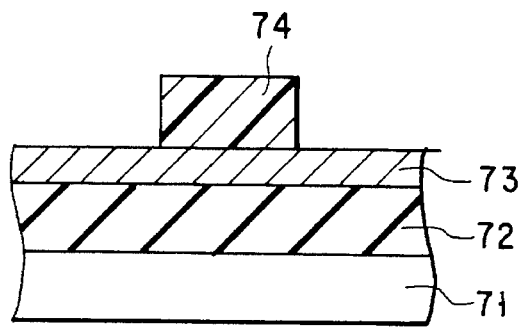
F I G. 30A
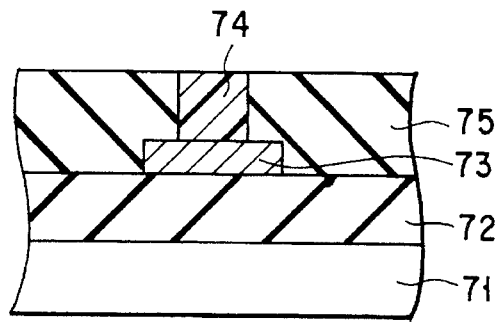
F I G. 30E
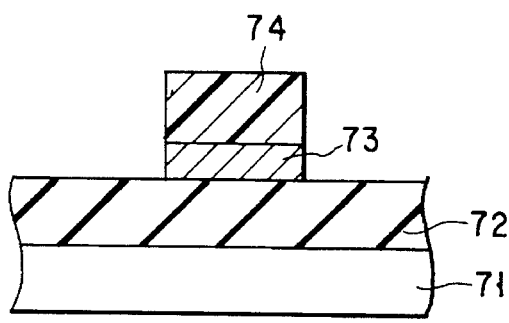
F I G. 30B
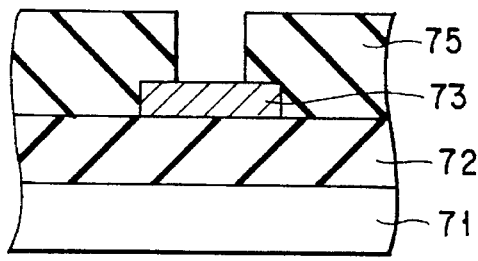
F I G. 30F
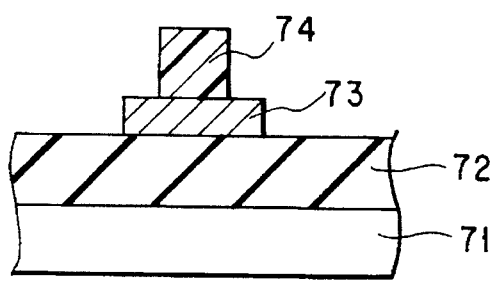
F I G. 30C
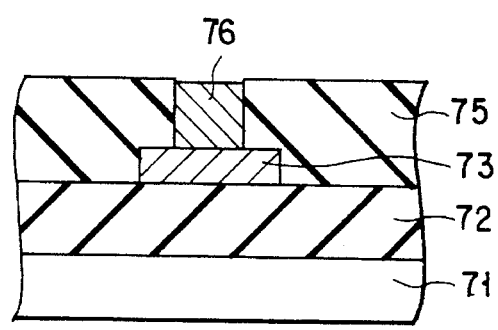
F I G. 30G
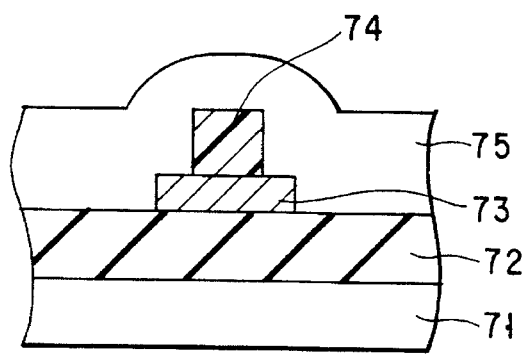
F I G. 30D

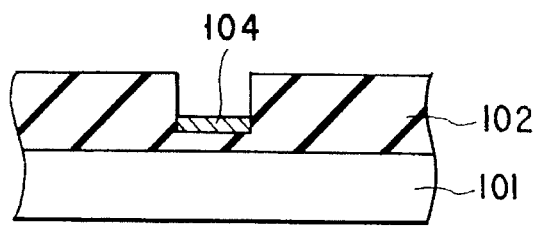
F I G. 36A
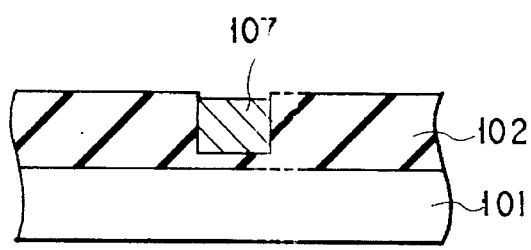
F I G. 37A
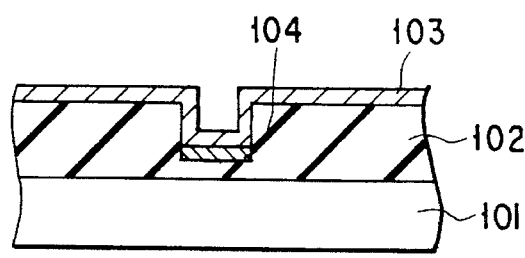
F I G. 36B
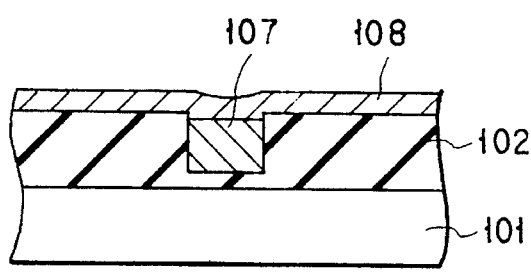
F I G. 37B
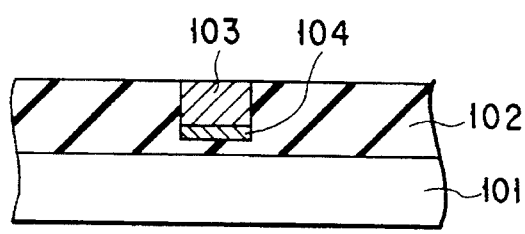
F I G. 36C
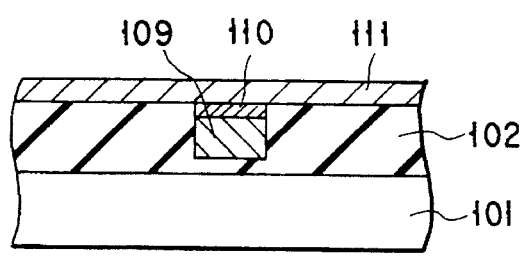
F I G. 37C
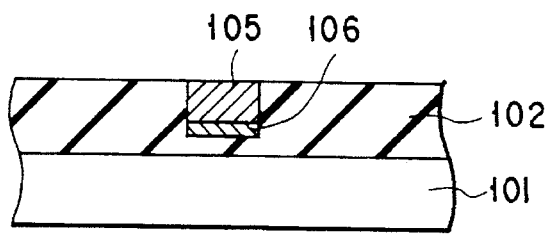
F I G. 36D
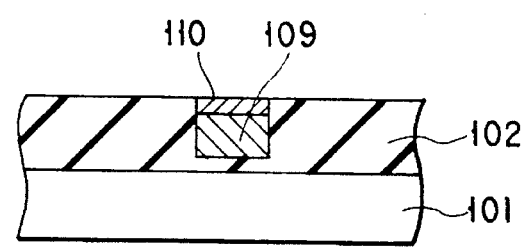
F I G. 37D

METHOD OF DIFFUSING A METAL THROUGH A SILVER ELECTRODE TO FORM A PROTECTIVE FILM ON THE SURFACE OF THE ELECTRODE

This application is a continuation of application Ser. No. 08/177,552, filed on Jan. 5, 1994, now abandoned.

BACKGROUND OF THE INVENTION

1. Field of the Invention

The present invention relates to a semiconductor device and a method of manufacturing the same and, more particularly, to an improvement of the wiring structure of a semiconductor device.

2. Description of the Related Art

As the integration density of a semiconductor device has been increased in recent years, a wiring layer has been decreased in thickness and width, and a multilayered wiring structure has been developed. As a conventional wiring material, Al has been used. However, even when the sectional area of a wiring layer is decreased by miniaturizing a device, a signal current is not reduced. For this reason, a current density is increased, and disconnection caused by electromigration poses a problem. In addition, in a multilayered structure requiring a large number of annealing processes, since a wiring layer receives complex heat hysteresis, disconnection caused by stress migration generated by heat stress acting on the wiring layer poses a problem.

As a next generation wiring material having an electrical resistance lower than that of Al and a high resistance to electromigration and stress migration, Cu and Ag begin to be considered. However, Cu is easily oxidized, and Cu is internally oxidized even at a low temperature, i.e., about 200° C. Since this oxidation causes an increase in resistance, it must be prevented.

In order to realize this, a method of protecting the surface of Cu with a protective film is proposed (Jpn. Pat. Appln. KOKAI Publication No. 63-156341). This technique will be described below with reference to FIGS. 1A to 1C.

As shown in FIG. 1A, an SiO$_2$ film 2 is formed on a silicon substrate 1, and a multilayered film constituted by a Ti film 3, a TiN film 4, a Cu film 5, and a TiN film 6 is formed on the SiO$_2$ film 2.

As shown in FIG. 1B, a TiN film 7 is deposited on the entire surface of the resultant structure such that the side surfaces of the multilayered film are covered with the TiN film 7.

Finally, as shown in FIG. 1C, the TiN film 7 on a portion except for the side surfaces of the multilayered film is selectively removed, so as to obtain a Cu wiring layer having a structure in which the Cu film 5 is covered with the TiN films 6 and 7.

However, this method cannot be easily, practically used because the method is complicated and requires a large number of processes.

As another method of forming a Cu wiring layer which is obtained by covering a Cu film with a protective film, a method using annealing is proposed (Jpn. Pat. Appln. KOKAI Publication No. 64-59938). This technique will be described below with reference to FIGS. 2A to 2C.

As shown in FIG. 2A, a diffusion barrier metal film 12 and a Cu—Ti alloy film 13 are sequentially deposited on an insulating film 11.

As shown in FIG. 2B, the diffusion barrier metal film 12 and the Cu—Ti alloy film 13 are patterned in a wiring form.

Finally, as shown in FIG. 2C, the resultant structure is annealed in a gas atmosphere containing N to diffuse Ti in the Cu—Ti alloy film 13 into the upper and side surfaces of the Cu—Ti alloy film 13 and to make the Cu—Ti alloy film 13 into a TiN film 14 and a Cu wiring layer 15 which serve as a protective film and as a wiring layer, respectively.

However, when the TiN film 14 is actually formed using this method, an annealing temperature must be set to be high to obtain the Cu wiring layer 15 having a low resistance, an impurity in the diffusion layer of a device is diffused again, and the device is degraded. When the annealing temperature is set to be low, Ti is left in the Cu wiring layer 15, and a wiring resistance is disadvantageously increased. In addition, when Ag is heated to about 70° C. or more in the air, it is easily aggregated. Therefore, almost no consideration has been made for Ag as a practical wiring material.

On the other hand, the integration density of a semiconductor device is increased, a wiring structure for connecting devices to each other is complicated, and each wiring layer is decreased in size. Conventionally, a metal is deposited on an insulating film deposited on a semiconductor substrate, and is processed to form a wiring layer, and an insulating film is deposited on the resultant structure so as to be flattened. However, as a wiring structure is micropatterned, processing of a metal and flattening of an insulating film cannot be easily performed. In addition, a void is disadvantageously formed in a narrow region of the insulating film between metal wiring layers.

As disclosed in Jpn. Pat. Appln. KOKAI Publication No. 63-244858, since an insulating film is etched easier than a metal and has a melting point higher than that of the metal, the following method is examined. That is, a groove is formed in the insulating film by reactive ion etching, and a fluidized metal is buried into the groove.

In addition, a method of forming a metal wiring layer by selective growth using a seed layer is known. This method will be described below with reference to FIGS. 3A to 3H.

As shown in FIG. 3A, an SiO$_2$ film 22 is deposited on a semiconductor substrate 21, a thin film 23 serving as a seed layer for selective growth is formed, and a resist pattern 24 is formed by a photolithographic technique. As shown in FIG. 3B, the thin film 23 is selectively etched using the resist pattern 24 as a mask. Thereafter, as shown in FIG. 3C, the resist pattern 24 is removed to obtain a pattern 23 serving as the seed layer.

As shown in FIG. 3D, an SiO$_2$ film 25 is deposited on the entire surface of the resultant structure, and as shown in FIG. 3E, resist patterns 26 are formed by a photolithographic process so as to be aligned with the position of the seed layer 23 under the SiO$_2$ film 25. At this time, in consideration of an alignment error, the resist patterns 26 must be formed such that the interval therebetween is smaller than the width of the seed layer 23.

As shown in FIG. 3F, the SiO$_2$ film 25 is etched by RIE using the resist patterns 26 as masks. As shown in FIG. 3G, the resist patterns 26 are removed, and a groove for a wiring layer is left in the SiO$_2$ film 25. Finally, as shown in FIG. 3H, a wiring material 27 is buried in the groove to form a wiring layer.

In the method shown in FIGS. 3A to 3H, the photographic process must be performed twice, and the process is complicated. In addition, since a larger seed layer must be formed in consideration of the alignment error between the seed layer and the resist pattern for forming the groove, micropatterning cannot be performed to the limit of photolithography.

As still another method, a method shown in FIGS. 4A to 4D is known. According to this method, as shown in FIG. 4A, an SiO₂ film 28 is deposited on the entire surface in the state shown in FIG. 3B, and as shown in FIG. 4B, the SiO₂ film 28 is polished using the resist pattern 24 as a stopper so as to be flattened. The resist pattern 24 is removed to form a groove for a wiring layer, and a wiring layer is formed on the seed layer by selective growth. According to this method, the shape of the patterned seed layer is formed to have a size smaller than that of the resist portion because of the following reason. That is, when palladium is used as the material of the seed layer, as shown in FIG. 3A, and etching is performed by a solution mixture of hydrochloric acid, nitric acid, and hydrogen peroxide, this etching progresses in a lateral direction using the resist pattern as a mask, thereby obtaining the shape shown in FIG. 4A. In addition, even when the resist pattern is formed by RIE, the shape described above is obtained by a deposit formed during etching. When a groove is formed in the structure having the above shape, the shape shown in FIG. 4C is obtained.

When selective growth is performed to the structure having the shape, a bottom portion having no seed layer is formed as shown in FIG. 4D, and cavities 29 are formed at the bottom portion. In addition, even when the cavities are buried with a wiring material, a large stress acts in lateral and vertical directions, cracks 30 occur, and the reliability of an element is degraded by the excessive stress.

SUMMARY OF THE INVENTION

It is an object of the present invention to provide a semiconductor device having a practical metal wiring structure which has a low resistance and can be used in place of an Al wiring structure.

It is another object of the present invention to provide a method of manufacturing a semiconductor device having a practical metal wiring structure which has a low resistance and can be used in place of an Al wiring structure.

It is still another object of the present invention to provide to a method of forming a metal wiring structure which can be micropatterned by a relatively simple process and which is formed by a burying method or selective growth without degrading semiconductor characteristics.

According to an aspect of the present invention, there is provided a semiconductor device comprising a first metal film formed on a semiconductor substrate, a second metal film formed on the first metal film and containing silver as a main component, and a film containing a metal element of the first metal film and covering at least an upper surface of the second metal film.

According to another aspect of the present invention, there is provided a method of manufacturing a semiconductor device, comprising the steps of forming a first metal film containing a first metal element on a semiconductor substrate, forming a second metal film containing silver as a main component on the first metal film, and performing annealing in an atmosphere containing a second element to diffuse part of the first element in the first metal film into the surface of the second metal film so as to form a protective film consisting of the second element and part of a metal in the first metal film on the surface of the second metal film.

According to still another aspect of the present invention, there is provided a method of manufacturing a semiconductor device, comprising the steps of forming a groove in a prospective wiring region of an insulating film on a semiconductor substrate, forming a metal film on the insulating film, annealing the metal film to fluidize the metal film so as to bury the groove with a metal, thereby forming a wiring layer in the groove, and removing the metal left on the insulating film.

According to still another aspect of the present invention, there is provided a method of manufacturing a semiconductor device, comprising the steps of forming first grooves in a plurality of prospective wiring regions of an insulating film on a semiconductor substrate, forming a second groove between the plurality of prospective wiring regions of the insulating film, forming a metal film on the insulating film, and annealing the metal film to fluidize the metal film so as to bury the first and second grooves with a metal, thereby forming wiring layers in the first grooves and forming a dummy wiring layer in the second groove.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5A to 5D are sectional view sequentially showing the steps of a method of manufacturing a buried Ag wiring layer according to the first embodiment of the present invention;

FIGS. 6 to 8 are SEM photographs showing the sections of structures obtained in the steps in FIGS. 5A to 5C;

FIGS. 9A to 9D are SEM photographs showing the sections of a Ag/Ti multilayered body;

FIGS. 30A to 30G are sectional views sequentially showing the steps of a method of manufacturing a buried Cu wiring layer according to the sixth embodiment of the present invention;

FIGS. 36A to 36D are sectional views showing the steps in purifying Cu by a reaction between Si and Ti in the tenth embodiment of the present invention; and FIGS. 37A to 37D are sectional views showing the other steps in purifying Cu by a reaction between Si and Ti in the tenth embodiment of the present invention.

DETAILED DESCRIPTION OF THE PREFERRED EMBODIMENTS

Figure 1A:
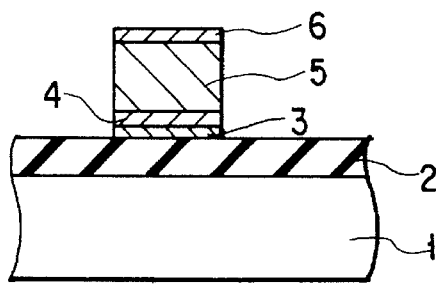
FIGS. 1A to 1C are sectional views sequentially showing the steps of a conventional method of forming a Cu wiring layer.
Figure 2A:
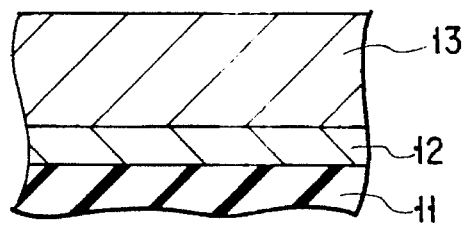
FIGS. 2A to 2C are sectional views sequentially showing the steps of another conventional method of forming a Cu wiring layer.

According to the first aspect of the present invention, a first metal film is formed on a semiconductor substrate, a second metal film, which consists of silver or contains silver as a main component, is formed on the first metal film, and a film which contains a metal element of the first metal film is formed to cover at least the upper surface of the second metal film.

In the present invention, as the material of the first metal film, for example, Ti, Si, In, Nb, Pb, Sb, Sn, Mg, Al, Cr, Be, or Zn can be used, or an alloy containing two or more of these elements can also be used. Of these elements, Ti is most preferable.

The film (protective film) which contains the metal element of the first metal film and covers at least the upper surface of the second metal film is formed by annealing in an atmosphere containing a predetermined element. That is, the annealing causes the metal element of the first metal film to be diffused in the second metal film, and the metal element reacts with the predetermined element in the atmosphere on the surface of the second metal film to form a film.

An annealing temperature is preferably set to be 450° C. to 750° C., and more preferably set to be 550° C. to 650° C.

Although oxygen or nitrogen can be used as the predetermined element contained in the annealing atmosphere, oxygen is most preferable. When the annealing atmosphere contains oxygen, an oxide film is formed; when the annealing atmosphere contains nitrogen, a nitride film is formed.

According to a semiconductor device of the present invention, in the second metal film, which consists of silver or contains silver as a main component, agglomeration of silver is suppressed by an amount of an area of the second metal film covered with the protective film, thereby improving reliability.

In addition, since at least the upper surface of the second metal film is covered with the protective film, a multilayered wiring structure can be advantageously formed. That is, when wiring layers each having the structure constituted by the first and second metal films are stacked on each other through an insulating interlayer, and contact holes which are used for connecting wiring layers to each other, are in contact with each of the wiring films, and have different depths are to be formed, the protective film can be used as an etching stopper film. For this reason, the contact holes having different depths can be formed at once.

According to the studies of the present inventors, in a multilayered film constituted by the first metal film and the second metal film containing silver as a main component, it was found that a diffusion rate of the metal of the first metal film in the second metal film was sufficiently higher than that of a compound or alloy consisting of the metals of the first and second metal films because of the following reason. That is, the metal of the first metal film may be mainly diffused through grain boundaries or the like.

For this reason, according to a method of manufacturing a semiconductor device according to the present invention, in the annealing process, the metal, in the first metal film, having an amount which is large enough to form the protective film is supplied by diffusion onto the surface of the second metal film serving as a main wiring layer and containing silver as a main component. Therefore, the protective film can be formed on the surface of the second metal film.

Therefore, according to the method of a semiconductor device according to the present invention, even when silver which has a low resistance but is easily aggregated is used as a wiring material, agglomeration of silver of the second metal film can be suppressed by the protective film formed on the second metal film serving as a main wiring layer. For this reason, a practical wiring layer utilizing a characteristic, i.e., low resistance, of silver, can be obtained. In addition, since the diffusion rate of the metal of the first metal film is high, the metal of the first metal film can be prevented from being left in the second metal film containing silver as a main component, and a wiring resistance can be suppressed to be low.

When the first and second metal films are formed in a groove, a sufficient amount of metal of the first metal film can be selectively supplied onto the upper surface portion of the second metal film at the upper portion of the groove. For this reason, a protective film can be selectively formed on the upper surface portion of the second metal film.

Figure 1B:
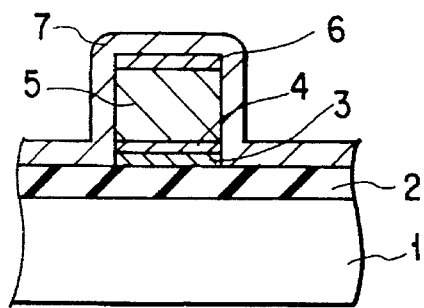
Figure 2B:
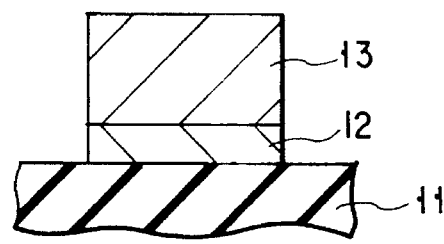
Figure 1C:
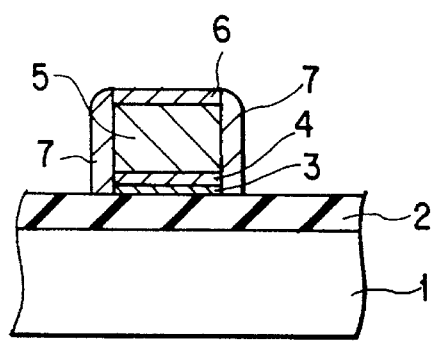
Figure 2C:
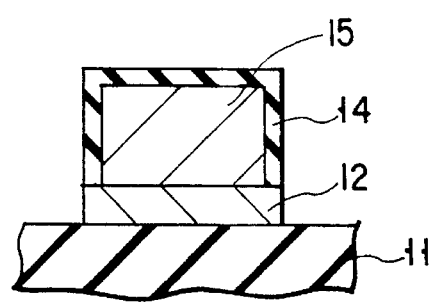
Figure 3A:
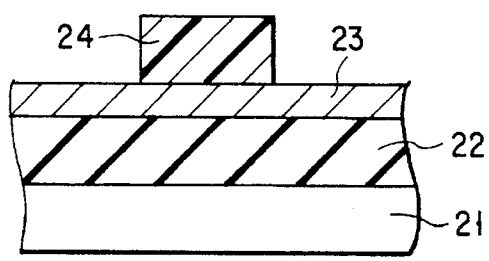
FIGS. 3A to 3H are sectional views sequentially showing the steps of a method of forming a metal wiring layer by conventional selective growth.
Figure 3E:
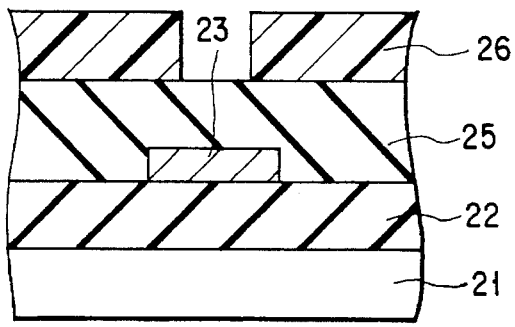
Figure 3B:
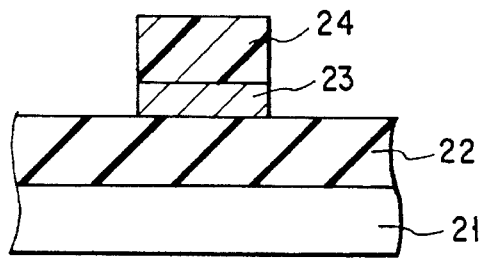
Figure 3F:
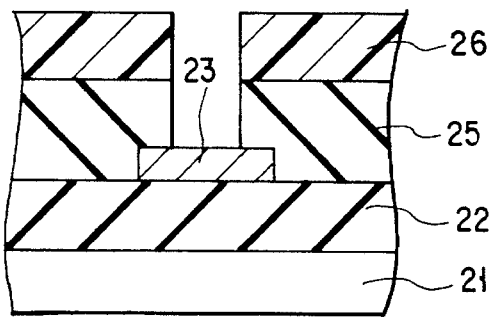
Figure 3C:
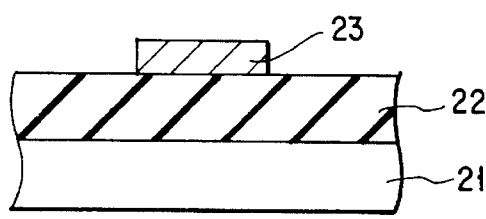
Figure 3G:
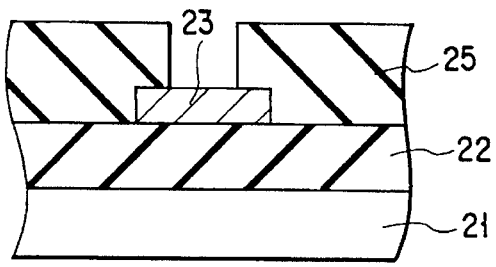
Figure 3D:
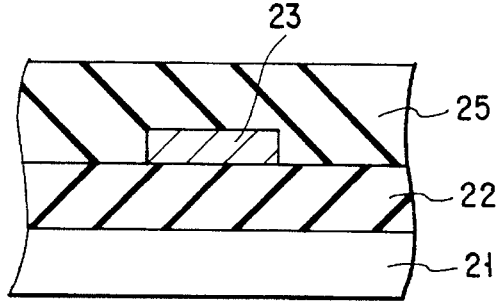
Figure 3H:
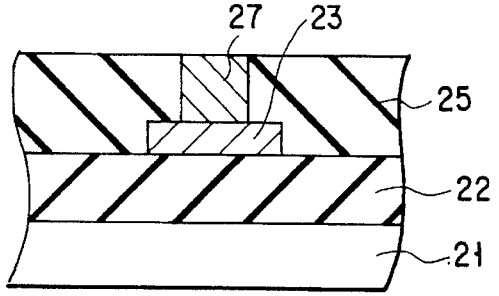
Figure 4A:
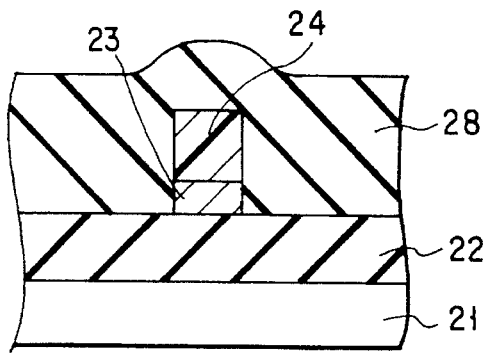
FIGS. 4A to 4D are sectional views sequentially showing the steps of a method of forming a metal wiring layer by other conventional growth.
Figure 4B:
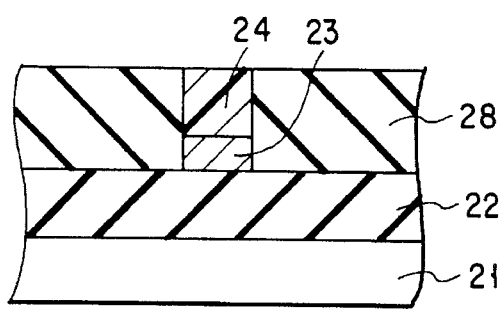
Figure 4C:
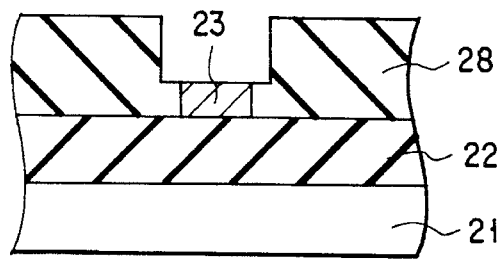
Figure 4D:
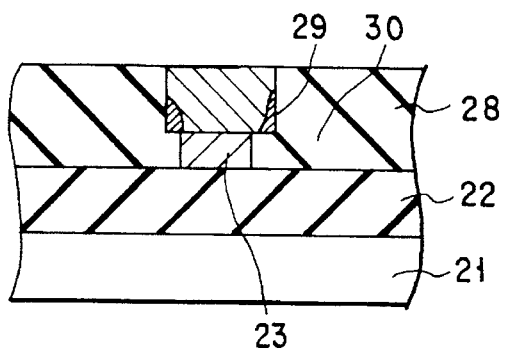

Therefore, this process is simpler than the process of covering a wiring layer with a protective film in the prior art shown in FIGS. 1A to 1C.

According to the second aspect of the present invention, a metal film is formed on an insulating film of a semiconductor substrate having a groove formed in a prospective wiring region, and the metal film is annealed to fluidize the metal. For this reason, the groove is buried with the metal, and a wiring layer is formed in the groove. At this time, although the metal is partially left on the insulating film, this metal is removed in the next process.

That is, when the groove of the insulating film is buried with the fluidized metal, the metal left on the insulating film except for the metal in the groove is removed by a method such as etching, thereby preventing a wiring layer from being defective. In particular, when Ag is used as a wiring material, Ag or an Ag alloy is buried in the groove of the insulating film by annealing. The melting point of Ag is 960° C., and an annealing temperature for Ag is high as that of the material of a buried wiring layer. For this reason, Ag has not been used as the material of a buried wiring layer. However, the resistivity of Ag is lower than that of any metal, and a low-resistance wiring layer can be obtained. A great deal of attention is given to Ag which is easily aggregated, and Ag is annealed at a temperature ranging from 200° C. to 600° C. to aggregate Ag or an Ag alloy, thereby burying the groove. Since the Ag or Ag alloy buried in the groove is recrystallized to have large grain sizes, a high electromigration resistance can be expected. In addition, when Ag or an Ag alloy left on the insulating film except for the Ag or Ag alloy in the groove is removed by a method such as etching, a wiring layer can be prevented from being defective.

According to the third aspect of the present invention, a second groove is formed between a plurality of prospective wiring regions of an insulating film, and a metal is buried in the second groove to form a dummy wiring layer.

As a result, when a plurality of grooves are buried with a fluidized metal, the metal can be prevented from being left on the insulating film except for the metal in the grooves, and a wiring layer can be prevented from being defective.

Various embodiments of the present invention will be described below with reference to the accompanying drawings.

FIGS. 5A to 5D are sectional views showing the processes of forming a buried Ag wiring layer according to the first embodiment of the present invention. FIGS. 6 to 8 are SEM photographs showing the sections of an actually formed wiring structure, and correspond to FIGS. 5A to 5C, respectively.

As shown in FIG. 5A, an $SiO_2$ film 32 is formed on a silicon substrate 31, and a groove for a buried wiring layer is formed in the $SiO_2$ film 32. In this case, although the $SiO_2$ film 32 is used as an insulating film, another insulating film, e.g., a polyimide film may be used.

A TiN film 33 having a thickness of 70 nm is formed as a diffusion barrier film. The TiN film 33 is grown by, e.g., sputtering, under the following conditions: a pressure in sputtering, $10^{-1}$ Pa; an $Ar/N_2$ ratio in an atmosphere, 50/50%; the concentration of residual $O_2$, about 10 ppm or less; and a current, 5 A. Thereafter, the TiN film 33 is densified by annealing at a temperature of 600° C.

A Ti film 34 (first metal film) having a thickness of 50 nm and an Ag film 35 (second metal film) having a thickness of 400 nm are sequentially formed on the TiN film 33. The Ti film 34 and the Ag film 35 are formed by, e.g., sputtering, under the following conditions: a pressure in sputtering, $10^{-1}$ Pa; a 100%-Ar atmosphere; the concentration of residual $O_2$, about 10 ppm or less (common in the Ti film 34 and the Ag film 35); and power, 1.5 kW (for the Ti film 34), and 1 kw (for the Ag film 35). It is preferable to continuously perform the sputtering processes while a vacuum state is kept.

As shown in FIG. 5B, the Ag film 35 is flattened. This flattening is performed as follows. That is, when the Ag film 35 is to be formed by sputtering, for example, annealing is performed at 400° C. while or after the Ag film 35 is formed by sputtering to reflow the Ag film 35, thereby flattening the Ag film 35.

As shown in FIG. 5C, the TiN film 33, the Ti film 34, and the Ag film 35 are removed except for those in the groove to form a buried Ag wiring layer. The TiN film 33, the Ti film 34, and the Ag film 35 are removed by wet etching, RIE, ion milling, polishing, or the like. More specifically, a diluted nitric acid solution is used in wet etching, and alumina or silica is used as a polishing material in polishing.

In this case, although the Ag film 35 is removed to flatten the surface of the entire structure, the level of the surface of the Ag film 35 in the groove may be set to be lower than that of the surface of the structure. In addition, if the TiN film 33, the Ti film 34, and the Ag film 35 except for those in the groove can be removed in the subsequent process without any disadvantage, the TiN film 33, the Ti film 34, and the Ag film 35 except for those in the groove may be left in this process.

Thereafter, the silicon substrate 31 is loaded into an annealing process chamber, a pressure in this annealing process chamber is reduced to a vacuum of $10^{-6}$ Torr or less.

Figure 11:
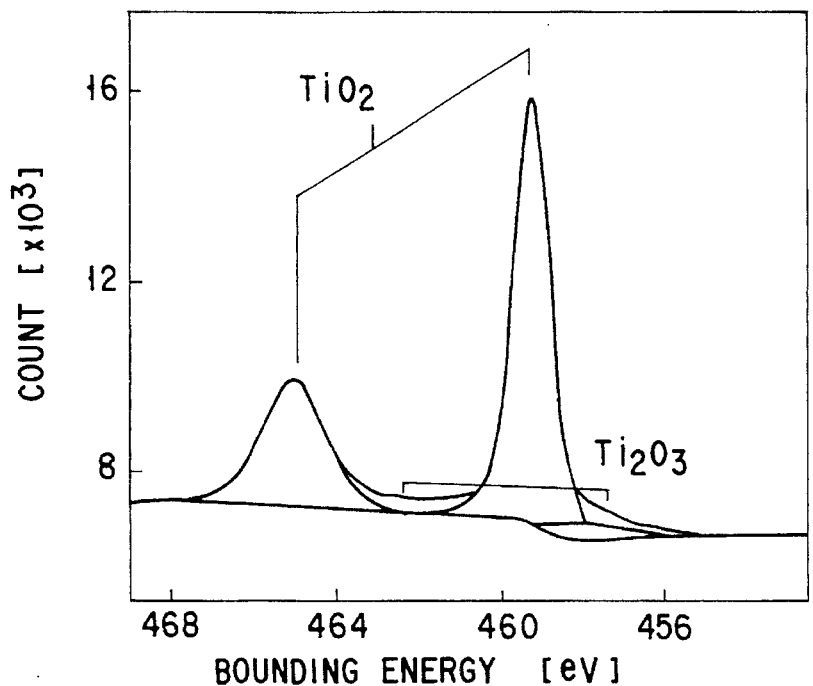
FIG. 11 is a graph showing the XPS spectra on the upper surface of the Ag film.

As shown in FIG. 5D, a rare gas containing $O_2$ (predetermined element), e.g., an Ar gas, is supplied into the annealing process chamber. The resultant structure is annealed at 600° C. in the Ar gas atmosphere for 30 minutes to form a $TiO_2$ film 36 on the upper surface of the Ag film 35. In this annealing process, the partial pressure of $O_2$ is set to be $10^{-10}$ Torr or more, and the partial pressure of Ar is set to be the atmospheric pressure. At this time, as shown in FIG. 9C, it is found that Ti is diffused to the surface of the Ag film 35. In addition, the XPS spectra of the upper surface portion of the Ag film 35 were calculated, a result shown in FIG. 11 was obtained, and it was confirmed that the $TiO_2$ film 36 was formed in the upper surface portion of the Ag film 35.

The reason why $TiO_2$ film 36 is formed in the upper surface portion of the Ag film 35 in the above annealing process is considered as follows. That is, Ti in the Ti film 34 is diffused in the Ag film 35 to reach the surface of the Ag film 35, and Ti reaching the surface reacts with $O_2$ in the atmosphere.

In addition, since the diffusion rate of Ti in the Ag film 35 is sufficiently higher than that of Ti in a compound or alloy of Ag and Ti, Ti having an amount required to form a protective film can be supplied onto the surface of the Ag film 35 even by annealing at a low temperature, i.e., 600° C., at which an impurity in a diffusion layer can be prevented from being diffused again as in this embodiment.

Figure 13:
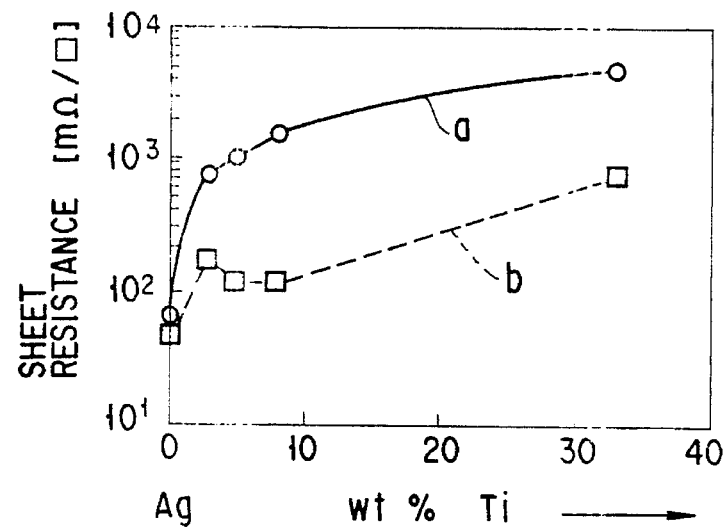
FIG. 13 is a graph showing a change in sheet resistance of a compound or alloy of Ag and Ti after and before annealing is performed.

FIG. 13 is a view showing that the diffusion rate of Ti in a film consisting of Ag and Ti is low. More specifically, FIG. 13 shows changes in sheet resistance of a compound or alloy of Ag and Ti after and before annealing is performed. In this case, the film thickness is 400 nm.

The sheet resistance before annealing is performed (curve a) is slightly different from the sheet resistance after annealing is performed (curve b). Even after annealing is performed, a high sheet resistance is kept. This is because the diffusion rate of Ti is low, Ti is not aggregated on the surface unlike the multi-layered film constituted by the Ag film 35 and Ti film 34, and a large amount of Ti is left in the compound or alloy of Ag and Ti.

This is because the diffusion type of Ti of the compound or alloy of Ag and Ti is bulk diffusion whose diffusion rate is low, but the diffusion type of Ti of the multilayered film constituted by the Ag film 35 and the Ti film 34 is grain boundary diffusion.

Figure 9D:
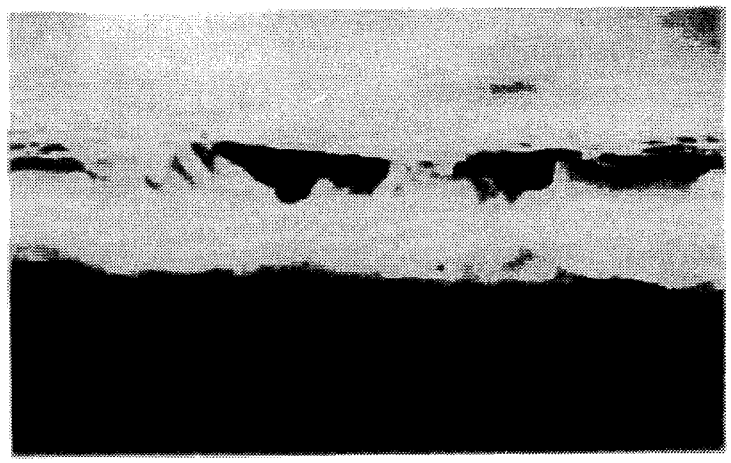

In this case, when annealing is performed at a temperature higher than 750° C., as shown in FIG. 9D, Ag and Ti react with each other to form a cavity. For this reason, the annealing must be performed at 750° C. or less to prevent degradation of reliability. In addition, annealing is performed at a temperature lower than 450° C., as shown in FIG. 9D, Ti is not diffused to the surface of the Ag film 35, and the $TiO_2$ film 36 is not formed. For this reason, the annealing must be performed 450° C. or more to reliably form the $TiO_2$ film 36. Note that FIG. 9A shows the state of the Ag film 35 immediately after the Ag film 35 is deposited by sputtering.

Therefore, annealing must be performed at a temperature ranging from 450° C. to 750° C. to form the $TiO_2$ film 36. In addition, when low-temperature annealing at about 600° C. is performed as in this embodiment, re-diffusion of an impurity in the diffusion layer is more effectively suppressed, thereby preventing degradation of an element.

Figure 10A:
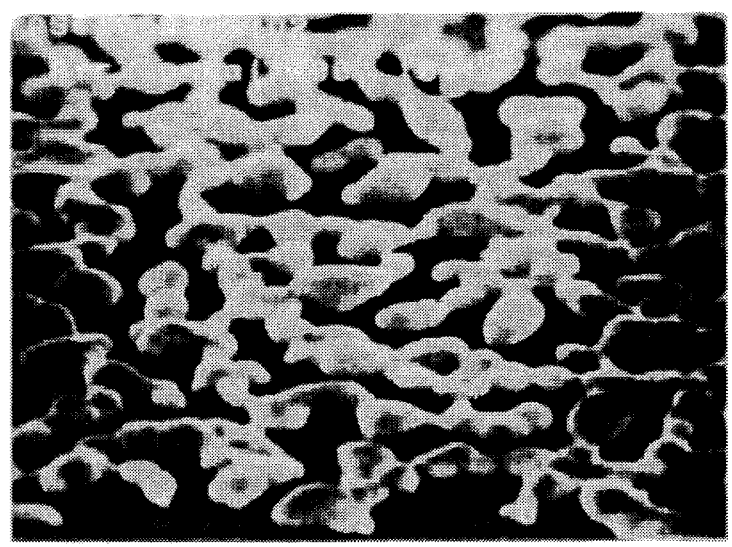
FIGS. 10A and 10B are SEM photographs showing the surface of an Ag layer.
Figure 10B:
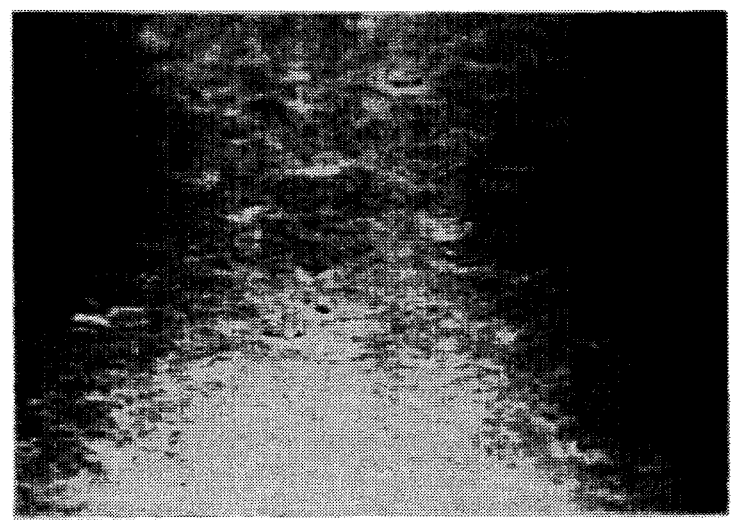

FIG. 10A shows the surface of an Ag film when annealing is performed in argon and oxygen, and FIG. 10B shows the surface of an Ag film when annealing is performed in the air according to this embodiment. As is apparent from FIGS. 10A and 10B, agglomeration of Ag is suppressed in the presence of $TiO_2$ film 36 serving as the protective film, and a preferable Ag wiring layer is formed. In addition, since the $TiO_2$ film 36 functions as a diffusion barrier film with respect to Ag, Ag in the Ag film 35 is prevented from being diffused in a film formed on the $SiO_2$ film 32 in the subsequent process.

Figure 12:
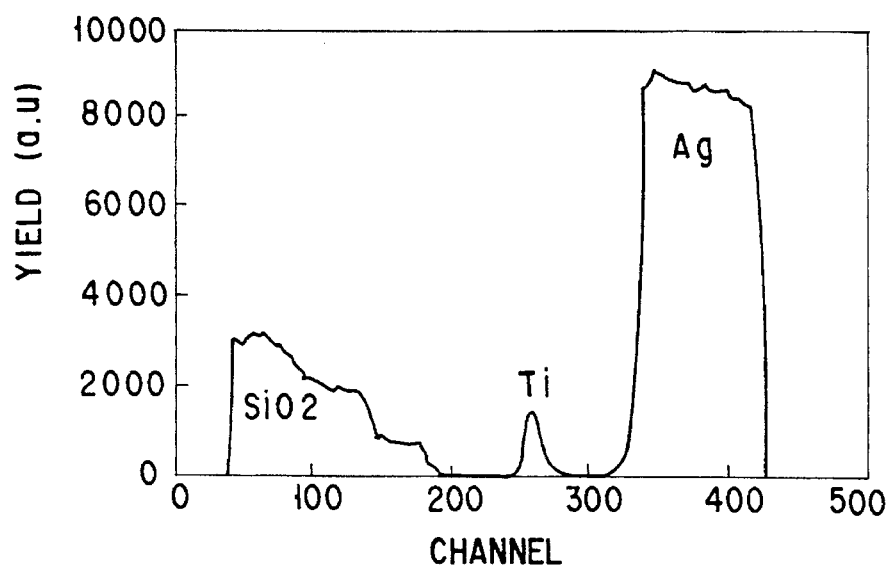
FIG. 12 is a graph showing the RBS spectra of an TiO₂/Ag/Ti—SiO₂ multilayered film.

When the RBS spectra of a sample (a multilayered film constituted by an $SiO_2$ film, a Ti film, an Ag film, and a $TiO_2$ film) formed according to the method of this embodiment were measured, as shown in FIG. 12, it was found that the Ti content in the Ag film was lower than the detection limit (1 atom %).

Figure 14:
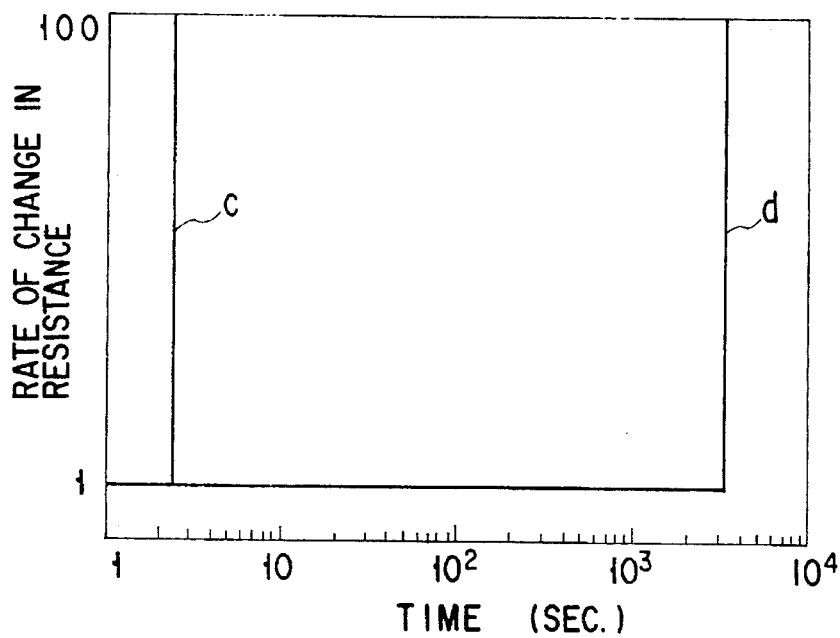
FIG. 14 is a graph showing the electromigration resistance of the Ag wiring layer.

FIG. 14 is a graph showing an electromigration resistance of an Ag wiring layer (curve d) formed according to the method of this embodiment. This graph shows a change in resistance ((resistance obtained after current is supplied)/ (resistance obtained before current is supplied)) before and after a current of $1.6 \times 10^7$ A/cm$^2$ is supplied to the Ag wiring layer. Referring to FIG. 14, a curve c indicates a comparative example, i.e., a change in resistance obtained when an Ag wiring layer is not covered with a $TiO_2$ film.

As is apparent from FIG. 14, when the Ag wiring layer of this embodiment is used, a rate of change in resistance is abruptly increased after the current is supplied for $10^3$ seconds, so as to cause disconnection. In contrast to this, in the comparative example, a rate of change in resistance is abruptly increased after the current is supplied for several seconds, so as to cause disconnection. As a result, it is understood that the Ag wiring layer of this embodiment has a high electromigration resistance.

Finally, as shown in FIG. 5D, an insulating interlayer 37 such as PSG is deposited on the entire surface of the resultant structure to complete the process of forming a buried wiring layer.

As described above, in the method of forming an Ag wiring layer according to this embodiment, the $TiO_2$ film 36 for preventing agglomeration of Ag can be formed on the surface of the Ag film 35 by annealing at a temperature at which an impurity in the diffusion layer is not diffused again. Therefore, a buried Ag wiring layer can be obtained without causing degradation of an element and degradation of reliability. In addition, since Ti is rarely left in the Ag film 35 by the annealing, the low-resistance characteristic of Ag is not degraded in the presence of Ti. Since the $TiO_2$ film 36 can be selectively formed on the upper surface portion of the Ag film 35, the Ag film 35 can be protected in the process which is simpler than the process of covering a wiring layer with a protective film according to the prior art shown in FIGS. 1A to 1C.

In this embodiment, annealing is performed in a gas atmosphere containing Ar and $O_2$. However, when annealing is performed using a nitrogen gas atmosphere in place of the gas atmosphere containing Ar and $O_2$ to nitrify the surface of the Ag film 35 so as to form a TiN film in place of the $TiO_2$ film 36, a resistance to agglomeration and a resistance to diffusion can be obtained as in a case wherein the $TiO_2$ film 36 is formed.

Figure 16:
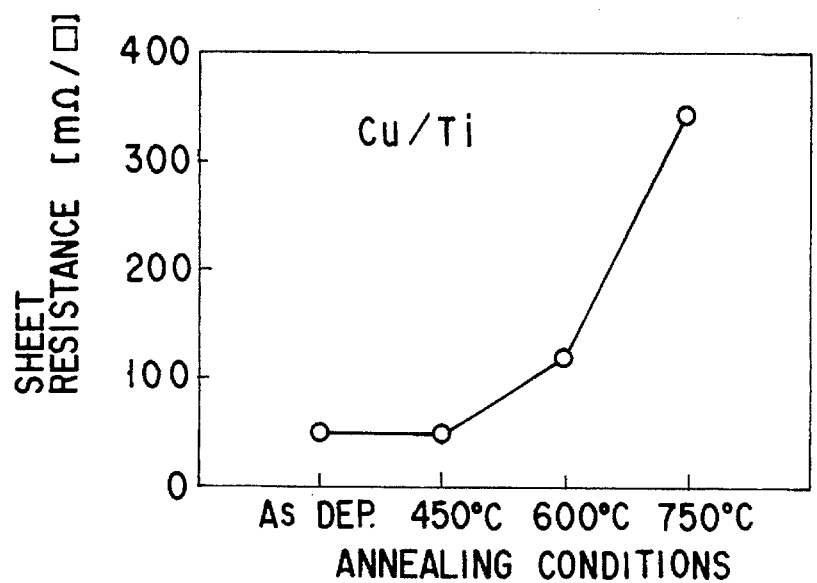
FIG. 16 is a graph showing the relationship between the annealing conditions and sheet resistance of a Cu/Ti multilayered film.

For comparison, the method described above was applied to a Cu (400 nm)/Ti (50 nm) multilayered film. FIG. 16 is a graph showing the relationship between an annealing temperature for this Cu/Ti multilayered film and the sheet resistance of a Cu film. Note that the annealing time is 30 minutes, and an Ar gas atmosphere is used.

Figure 15:
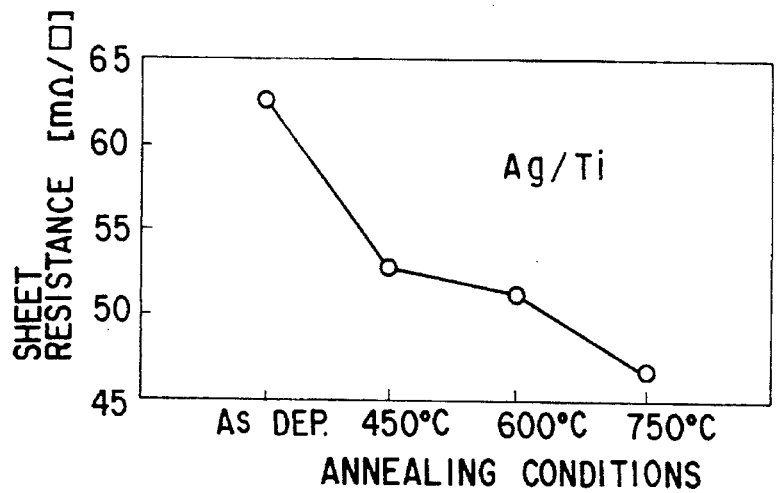
FIG. 15 is a graph showing the relationship between the annealing conditions and sheet resistance of an Ag/Ti multilayered film.

When Cu film is used, as is apparent from FIG. 16, a sheet resistance at about 600° C. or more is 100 Ω/☐ or more. When the Ag (400 nm)/Ti (50 nm) multilayered film is used, as is apparent from FIG. 15, a sheet resistance at 450° C. or more is about 53 Ω/☐ or less. The sheet resistance is increased when Cu is used as described above, because Ti is left in the Cu film more easily than in the Ag film, an increase in resistance caused by an impurity occurs by the left Ti. In particular, since diffusion or the like begins to progress at about 600° C., and the protective film begins to be formed, the effect of increasing the resistance is enhanced.

Figure 17:
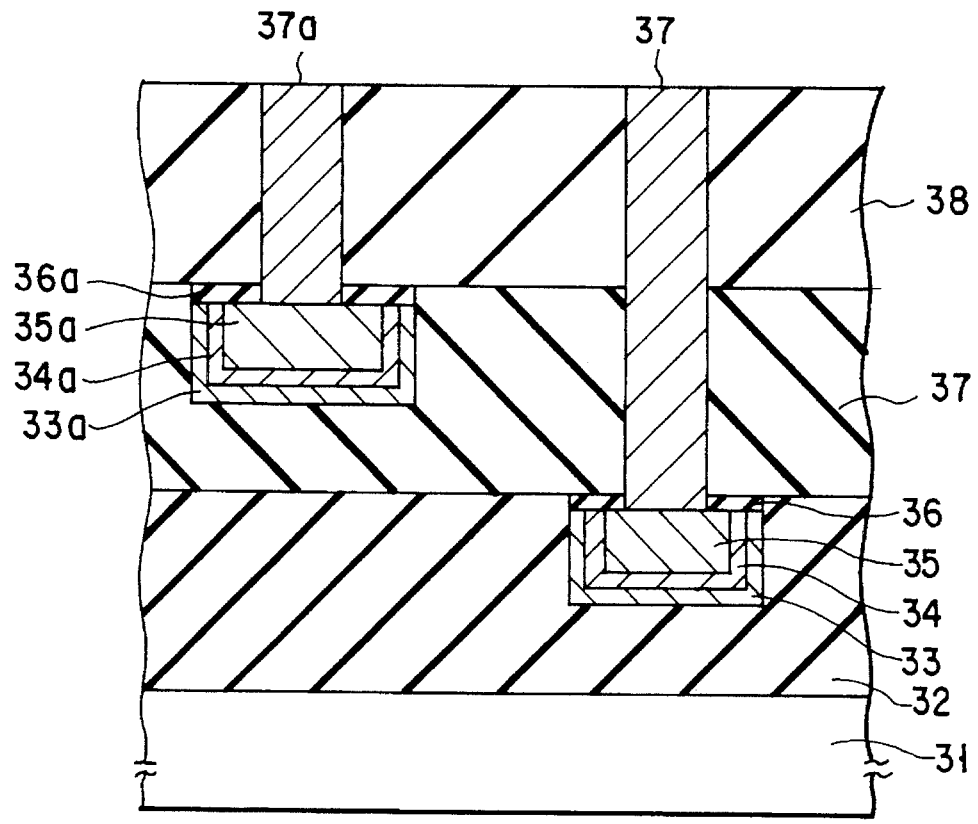
FIG. 17 is a sectional view showing a buried Ag wiring structure according to the second embodiment of the present invention.

FIG. 17 is a view showing a buried Ag wiring structure according to the second embodiment of the present invention. In this embodiment, the first embodiment is applied to a multilayered wiring layer.

The second embodiment will be described below according to the processes of forming the buried Ag wiring structure. After an $SiO_2$ film 32 is formed on a silicon substrate 31, as in the previous embodiment, a TiN film 33, a Ti film 34, an Ag film 35, a $TiO_2$ film 36, and an insulating interlayer 37 are formed.

After a groove for a buried wiring layer is formed in the surface of the insulating interlayer 37, a TiN film 33a, a Ti film 34a, an Ag film 35a, and a TiO$_2$ film 36a are formed by the same method as the method of forming the TiN film 33, the Ti film 34, the Ag film 35, and the TiO$_2$ film 36.

After an insulating interlayer 38 is deposited on the entire surface of the resultant structure, the insulating interlayers 37 and 38 are etched using the TiO$_2$ films 36 and 36a as etching stopper films to expose the TiO$_2$ films 36 and 36a. In this manner, even when the distances between the upper surface of the insulating interlayer 38 and the TiO$_2$ films 36 and 36a are different from each other, two grooves having different depths can be simultaneously formed because the TiO$_2$ films 36 and 36a function as the etching stopper films.

Finally, after the TiO$_2$ films 36 and 36a are removed by HF, connection wiring layers 37 and 37a are formed. Note that since each of the TiO$_2$ films 36 and 36a has a very small thickness, i.e., as small as about 150 Å, if the TiO$_2$ films 36 and 36a are not removed, electrical connection is not degraded.

As described above, according to this embodiment, a multilayered buried Ag wiring layer having a low resistance and high reliability can be formed in the simple processes because contact holes having different depths can be simultaneously formed.

Note that the present invention is not limited to the embodiments described above. For example, although a buried wiring layer has been described in each of the above embodiments, the present invention can be applied to a wiring layer having a structure different from that of the buried wiring layer.

According to the first and second embodiments described above, since agglomeration of Ag in an Ag film can be suppressed, Ag which has been rarely considered as a wiring material because Ag is easily aggregated although it has a low resistance can be used, and a wiring layer utilizing the low-resistance characteristics of Ag can be obtained.

The third embodiment of the present invention will be described below with reference to FIGS. 18A to 18D.

Figure 18A:
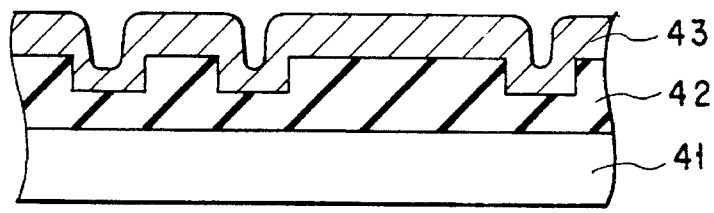
FIGS. 18A to 18D are sectional views sequentially showing the steps of a method of forming a buried Ag wiring layer according to the third embodiment of the present invention.

As shown in FIG. 18A, an SiO$_2$ film 42 is formed on a semiconductor substrate 41 to have a thickness of about 1.0 μm. Grooves each having a width of 0.5 μm and a depth of 0.4 μm are formed by a lithographic process and an etching process. An Al metal film 43 is deposited on the resultant structure to have a thickness such that the grooves are almost buried. Note that, before the Al metal film is deposited, a Ti or TiN film may be deposited to control wetting properties of the metal film.

Figure 18B:
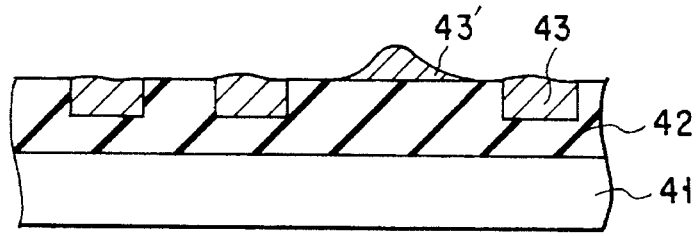

Annealing at about 500° C. is performed in the same chamber as that in which the Al metal film 43 is deposited. At this time, Al is fluidized and moves to weaken the surface tension of Al, and its shape is changed. That is, since total energy is decreased, as shown in FIG. 18B, Al tends to flow into the grooves. However, a hemispherical or island-like excess 43' which cannot flow into the groove may be left at a portion having a large wiring interval. Note that, as the material buried in this case, a metal such as Al, Au, Ag, or Cu used in a wiring layer for an LSI or an alloy containing these metals as main components may be used.

After the metal is deposited by sputtering, the resultant structure may be temporarily exposed in the air to be annealed so as to be activated. At this time, an oxide is produced on the surface of the metal to prevent fluidization of the metal. If fluidization does not occur, annealing is performed in an atmosphere containing hydrogen. If annealing is performed in an atmosphere in which fluidization is enhanced, fluidization is performed at a low temperature. For this reason, low-temperature annealing can be realized.

For example, Ag is used, annealing may be performed in an atmosphere containing oxygen.

Figure 18C:
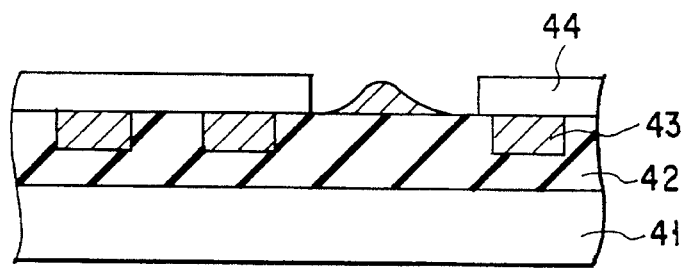

As shown in FIG. 18C, a resist film 44 is formed to cover the wiring region.

Figure 18D:
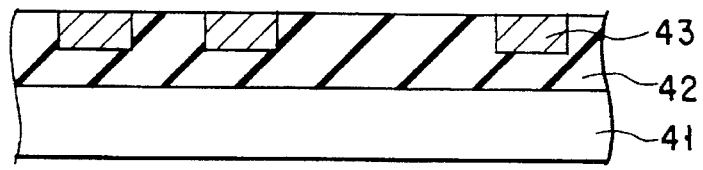

As shown in FIG. 18D, after the excess 43' is removed by an etchant such as phosphoric acid, and the resist film 44 is peeled, thereby obtaining a desired wiring shape.

The shape of the resist pattern 44 covering the wiring region has a shape obtained by thickening the shape of the wiring pattern. In addition, after Al is buried into the grooves, when a resist film is formed on the entire surface of the resultant structure, and RIE is performed to the entire surface under the conditions such that the etching rates of the resist and Al are equal to each other, only excessive Al can be removed.

In addition, after Al is buried into the grooves, W which is a relatively hard material may be deposited on the entire surface of the resultant structure and then subjected to mechanical polishing.

The fourth embodiment of the present invention will be described below with reference to FIGS. 19 to 25B.

Figure 19:
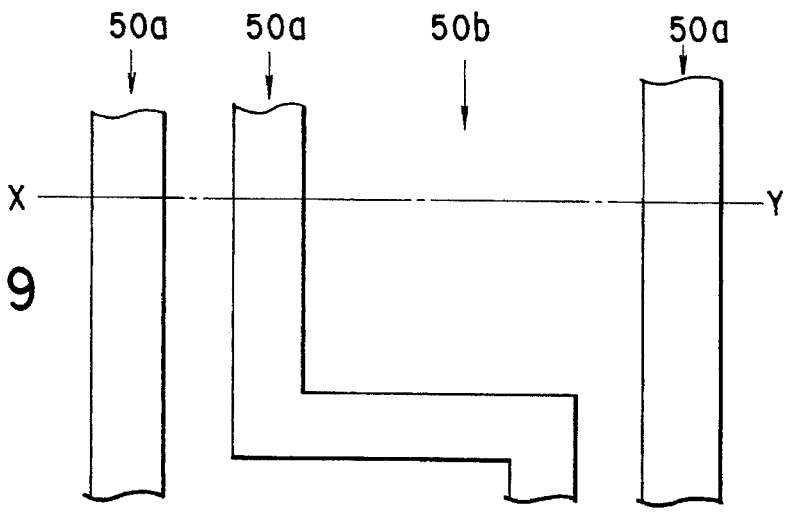
FIG. 19 is a plan view showing a normal surface pattern.
Figure 20:
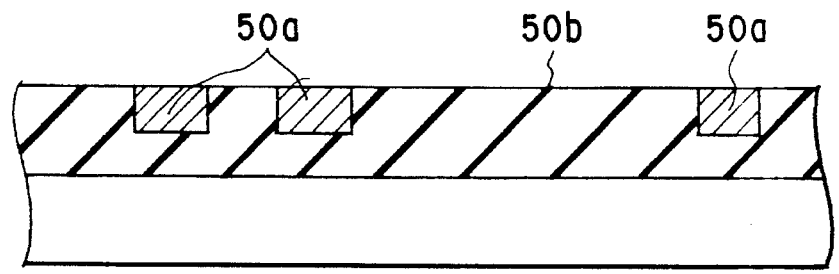
FIG. 20 is a sectional view of FIG. 19.

FIG. 19 is a plan view showing a general wiring layer. A large region 50b having no wiring layers 50a are present. FIG. 20 shows an ideal shape of a section along a Y—Y line in FIG. 19. However, according to the prior art, the excess 43' is left as described in the third embodiment so as to form a defective wiring layer (FIG. 18B).

Figure 21A:
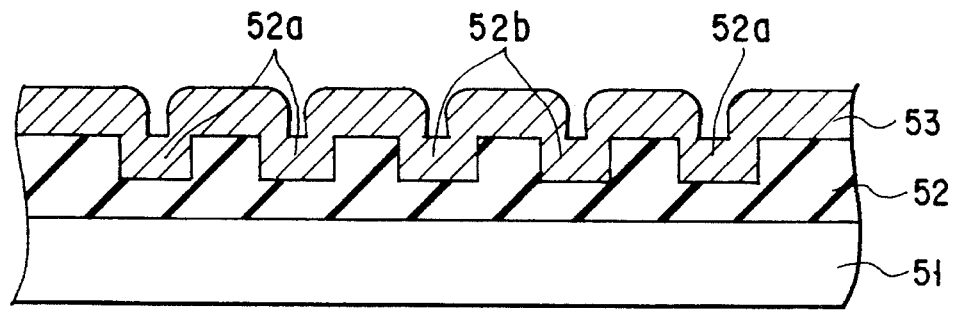
FIGS. 21A and 21B are sectional views sequentially showing the steps of a method of manufacturing a buried Al wiring layer according to the fourth embodiment of the present invention.

According to this embodiment, as shown in FIG. 21A, an insulating film 52 consisting of, e.g., SiO$_2$, is deposited on a semiconductor substrate 51 to have a thickness of about 1 μm, grooves 52a in which wiring layers are to be originally buried, and dummy grooves 52b are formed in a region in which no wiring layer is to be originally formed. Note that the grooves 52a and 52b may be formed in different processes or the same process.

Figure 21B:
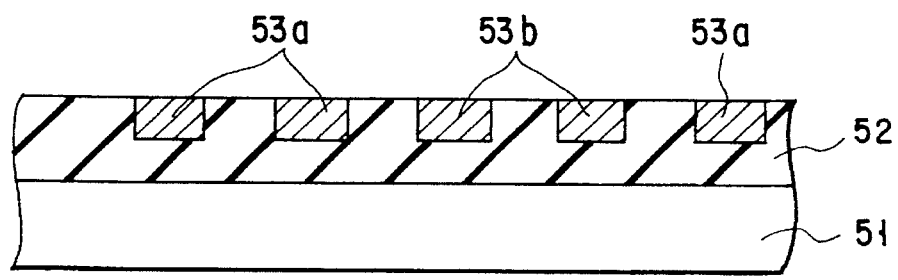

As in the third embodiment in which Al is deposited by sputtering, an Al film 53 is fluidized, and the Al film 53 is buried into the wiring grooves 52a and the dummy grooves 52b. At this time, the Al film 53 may be flattened by selective etching or entire-surface RIE used in the first embodiment. As a result, as shown in FIG. 21B, original wiring layers 53a and dummy wiring layers 53b are formed, and excessive Al is not left. Therefore, an ideal wiring shape can be obtained.

Figure 22:
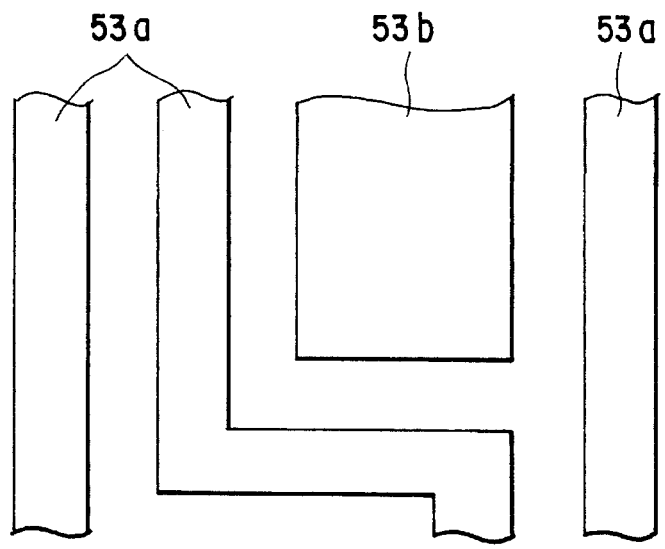
FIGS. 22 to 24 are plan views showing various dummy patterns according to the fourth embodiment of the present invention.
Figure 23:
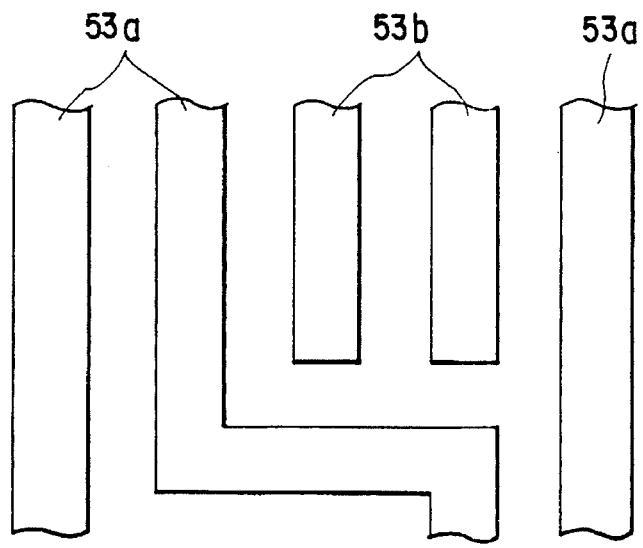
Figure 24:
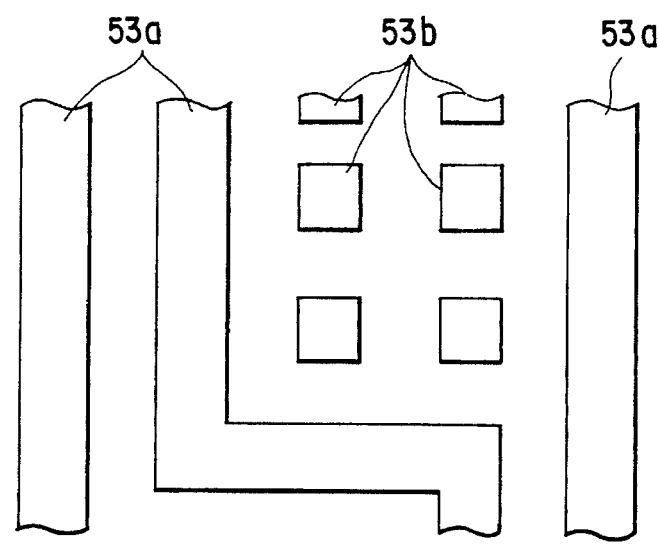

A dummy pattern may be a planar pattern as shown in FIG. 22, a line pattern as shown in FIG. 23, or a dot pattern as shown in FIG. 24. In addition, a pattern obtained by composing or assembling these patterns may be used as the dummy pattern.

Although the next process may be performed while the dummy wiring layers 53b are left, the process of removing the dummy wiring layers will be described in this embodiment.

Figure 25A:
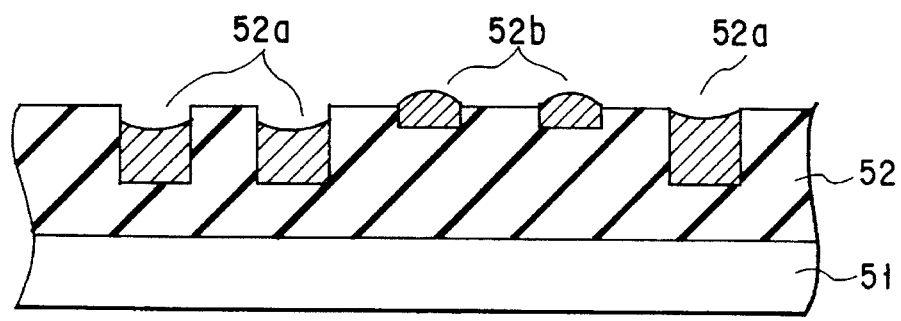
FIGS. 25A and 25B are sectional views sequentially showing the steps of removing a dummy wiring layer according to the fourth embodiment of the present invention.
Figure 25B:
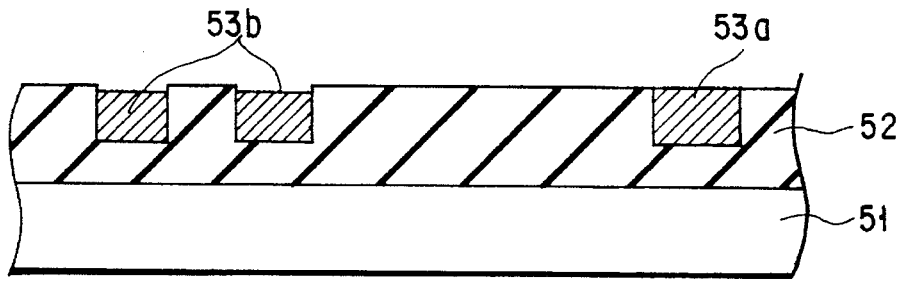

In the process described above, as shown in FIG. 25A, each of the grooves 52b for the dummy wiring layers is formed to have a depth smaller than that of each of the grooves 52a for the original wiring layer, the processes up to the process of burying Al are performed in the same manner as described above. A resist film is formed on the entire surface of the resultant structure, and RIE is performed to the entire surface under the conditions such that the etching rates of Al and the resist are equal to each other. In this case, as shown in FIG. 25B, only the dummy wiring layers each having a small depth can be removed.

Only the dummy wiring layers may be removed such that a relatively hard material such as w is deposited on the entire surface and then mechanically polished. In this case, when the polishing is performed under the condition that the W layer and the insulating film are polished to have the same depth, a flat shape can be obtained. In this manner, when the thickness of the dummy wiring layer is small, or no dummy wiring layers are present, a wiring capacitance is decreased, thereby increasing the operating speed of an LSI.

The fifth embodiment of the present invention will be described below with reference to FIGS. 26A to 26F.

Figure 26A:
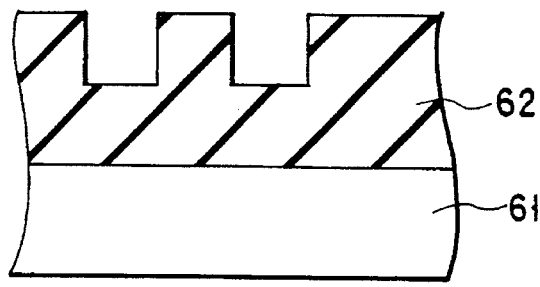
FIGS. 26A to 26F are sectional views sequentially showing the steps of a method of manufacturing a buried Ag wiring layer according to the fifth embodiment of the present invention.

As shown in FIG. 26A, an insulating interlayer 62 is formed on a semiconductor substrate 61, and a resist is coated on the entire surface of the resultant structure and exposed and developed to form a resist pattern. Wiring grooves are formed by anisotropic etching such as RIE, and the resist pattern is removed by $O_2$ ashing or the like.

Figure 26B:
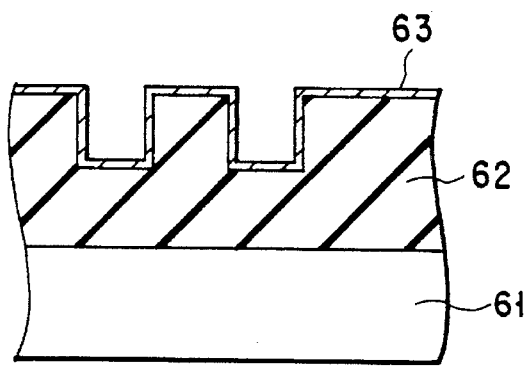

As shown in FIG. 26B, a thin film 63 having a function of improving the adhesion properties between Ag and an insulating interlayer, a function of preventing diffusion of Ag in the insulating interlayer, and a function of improving the wetting properties between Ag and the insulating interlayer is formed on the entire surface of the resultant structure by deposition or sputtering. As the material of the thin film 63, a metal such as Ti, TiN, Al, Ni, Pd, Nb, Au, Pb, Mg, or Tl, a semiconductor such as Si or Sb, or an insulator such as SiN may be used. A multilayered film may be formed by combining several types of materials.

Figure 26C:
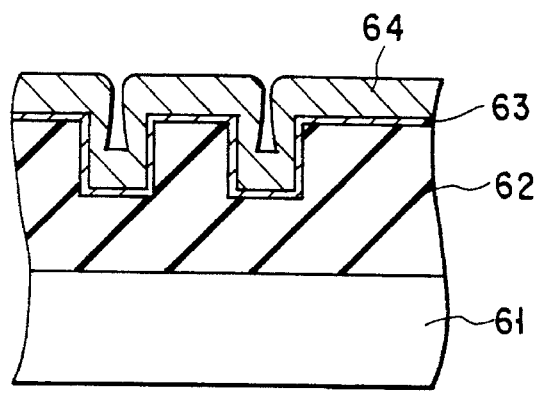

As shown in FIG. 26C, an Ag film 64 is formed to have a thickness 0.3 times or equal to the depth of each wiring groove. Although the Ag film 64 may be formed by any method such as deposition or sputtering, the Ag film 64 is formed with good step coverage on the side wall of the groove.

Figure 26D:
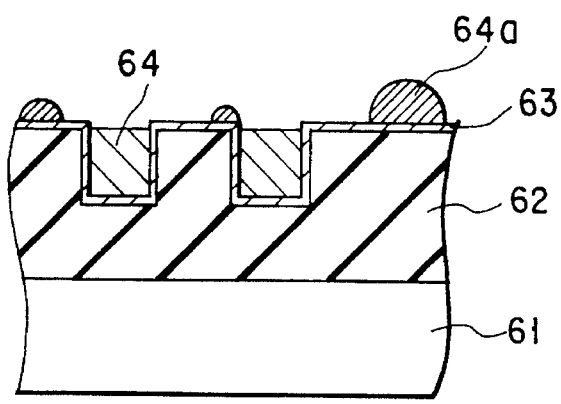

Thereafter, annealing at about 200° C. to 600° C. is performed, as shown in FIG. 26D, the Ag film 64 is aggregated to bury the wiring groove. In this case, it is known that when annealing for Ag is performed in an atmosphere containing a small amount of oxygen or hydrogen, agglomeration of Ag easily occurs, and Ag is fluidized at a relatively low temperature. In addition, although an oxide film may be produced on the surface of Ag when annealing for Ag is performed in an atmosphere containing a small amount of oxygen, the annealing may be performed in a reducing atmosphere to remove the oxide film. At this time, an excessive Ag 64a is present on a wiring space. The following process is performed to remove this excessive Ag 64a.

Figure 26E:
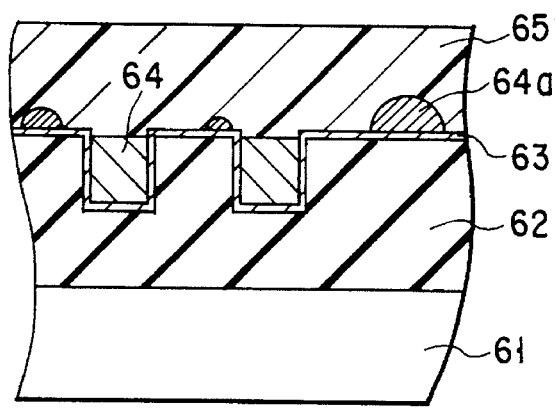
Figure 26F:
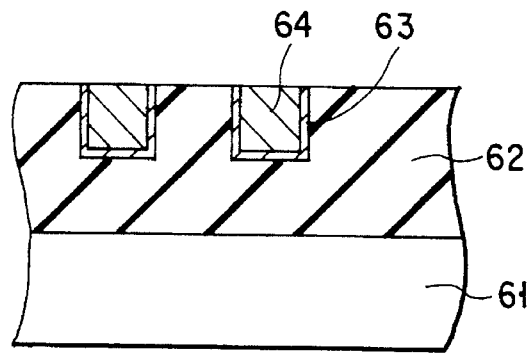

As shown in FIG. 26E, a resist 65 is formed on the entire surface of the resultant structure. As shown in FIG. 26F, etching is performed to the entire surface to simultaneously remove the excessive Ag 64a and the intermediate film 63 between the excessive Ag 64a and the insulating interlayer 62. In this manner, the excessive Ag 64a present in the region of the wiring space is removed, and an ideal Ag wiring pattern 64 can be formed.

In the processes described above, although Ag is used as a wiring material, a material such as an Ag alloy which is easily aggregated can be used as the wiring material. In addition, as a method of forming a wiring groove, a method obtained by combining a resist mask and isotropic etching or a method obtained by combining a resist mask and $SiO_2$ selective growth from a liquid phase can be used. As a method of removing residual Ag, in addition to the resist etch back described above, polishing can be advantageously used.

Figure 27A:
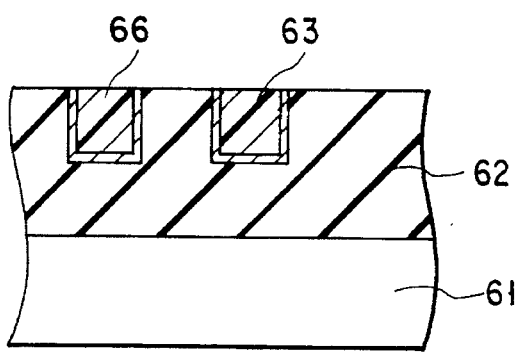
FIGS. 27A to 28 are sectional views showing modifications of the fifth embodiment of the present invention.
Figure 27B:
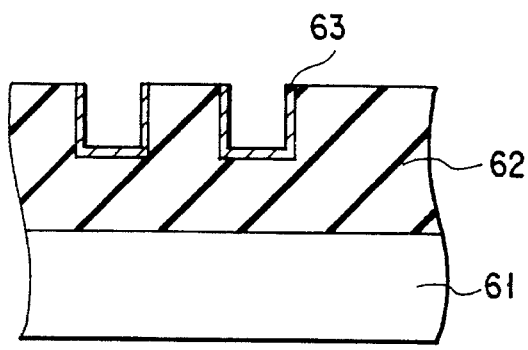

Various modifications of the fifth embodiment described above will be described below with reference to FIGS. 26A to 29E. In the above embodiment, although the thin film 63 is formed on the entire surface of the insulating interlayer in which the grooves are formed, the thin film 63 may be formed in only each of the grooves. When the metal film is to be fluidized by annealing in the subsequent process, if a thin film such as a Ti film or a TiN film for improving wetting properties is formed in the groove, the metal on the insulating film except for the metal in the groove easily flows into the groove, thereby efficiently performing the burying process. In order to form such a thin film, after the process shown in FIG. 26B, a resist film 66 is formed on the entire surface of the resultant structure, RIE is performed to the entire surface such that the etching rates of the resist film and the thin film material such as Ti or TiN are equal to each other, and as shown in FIG. 27A, the Ti or TiN film on the surface of the surface is removed. As shown in FIG. 27B, the resist film 66 is removed, and the thin film is left in only each of the grooves.

Figure 28:
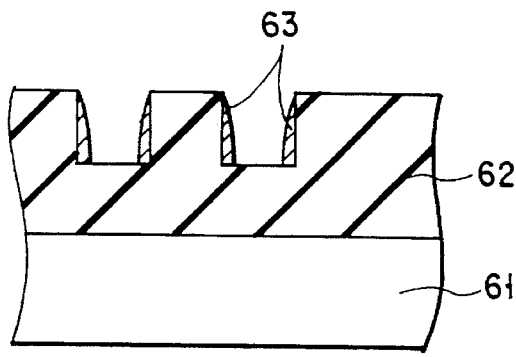

Even when the thin film 63 is formed on only the side wall portions of each of the grooves or on only the bottom portion of each of the grooves, the same effect as described above can be obtained. For example, when a thin film is formed on only each of the side wall portions of the groove as shown in FIG. 28, anisotropic etching may be performed after the process shown in FIG. 26B.

Figure 29A:
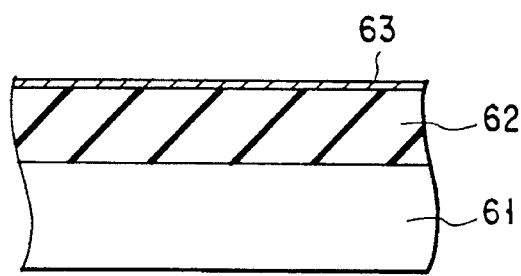
FIGS. 29A to 29D are sectional views showing the steps of manufacturing another modification of the fifth embodiment of the present invention.
Figure 29B:
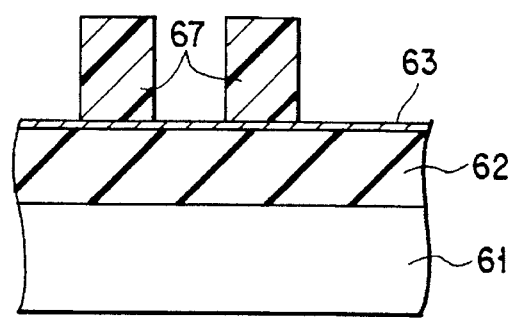

In order to form a thin film on the bottom portion of each of the grooves, the processes shown in FIGS. 29A to 29D are preferably performed. As shown in FIG. 29A, the insulating interlayer 62 is deposited on the semiconductor substrate 61 to have a thickness of about 0.6 μm, and the Ti or TiN film 63 is deposited. As shown in FIG. 29B, a resist pattern 67 is formed on a wiring region. The Ti or TiN film 63 is etched using the resist pattern 67 as a mask.

Figure 29C:
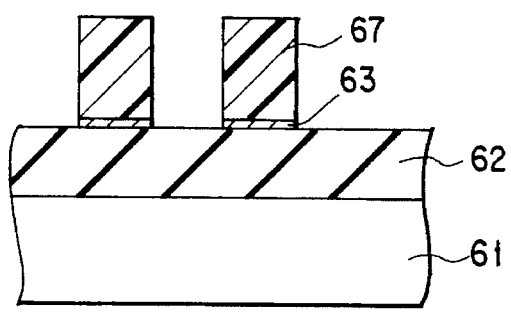
Figure 29D:
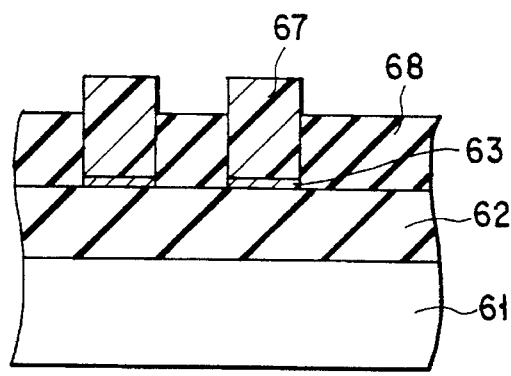

As shown in FIG. 29C, an insulating film is selectively grown by plasma ECR or a liquid-phase growth method using the resist pattern. Thereafter, as shown in FIG. 29D, the resist pattern 67 is removed, so that the Ti or TiN film can be formed on the bottom portion of each of the grooves.

The sixth embodiment of the present invention will be described below with reference to FIGS. 30A to 30G.

As shown in FIG. 30A, an $SiO_2$ film 72 is formed on a semiconductor substrate 71, a palladium film 73 serving as a seed for selective growth is deposited to have a thickness of 500 Å, and a resist pattern 74 is formed thereon by a photolithographic process. As shown in FIG. 30B, the palladium film 73 is processed by a method such as ion milling using the resist pattern 74 as a mask.

As shown in FIG. 30C, when the resultant structure is exposed in an oxidizing atmosphere, e.g., an oxygen plasma, or an ozone atmosphere, the resist pattern 74 can be thinned. When the oxygen plasma is used, since the resist pattern can be thinned at an etching rate of several hundreds Å/min, a fine pattern can be formed with excellent reproducibility and workability.

As shown in FIG. 30D, an $SiO_2$ film 75 is deposited on the entire surface of the resultant structure. The $SiO_2$ film 75 is deposited by an atmospheric-pressure CVD method, a liquid-phase growth method, or the like. When the liquid-phase growth method is used, since the resist pattern is exposed in an oxygen atmosphere, the $SiO_2$ film can also be deposited on the resist pattern. In this case, although the $SiO_2$ film is used, any insulating film, e.g., a polyimide film, may be used.

Subsequently, as shown in FIG. 30E, the $SiO_2$ film 75 is flattened by a method such as polishing. At this time, the resist pattern 74 functions as an etching stopper. Note that, as the flattening method, a method such as resist etch back in which the resist pattern 74 is coated on the entire surface of the SiO$_2$ film 75 and RIE is performed to the resist pattern 74 may be used.

As shown in FIG. 30F, the resist pattern 74 is exposed in an oxygen plasma or the like and subjected to ashing to be removed, thereby forming a groove in which a wiring layer is to be formed. As shown in FIG. 30G, a Cu film 76 is selectively deposited on the palladium film 73 by electroless plating so as to form a wiring layer. At this time, since the palladium film 73 serving as a seed layer on the bottom portion of the groove is present on the entire bottom portion of the groove, excellent selective Cu growth caused by electroless plating can be performed. Since the resist pattern 74 is thinned to have a size smaller than a minimum size obtained by a lithographic technique, a pattern finer than the finest pattern obtained by a conventional lithographic technique can be obtained.

In the embodiment described above, although the Cu wiring layer formed by electroless plating is used, the method of forming the Cu wiring layer is not limited to the electroless plating, any material which can be selectively grown and any method which can selectively grow the material may be used. For example, a method such as a selective CVD method or electroless plating may be used as the method of selectively growing a material, and silver, gold, tungsten, or aluminum may be used as a material.

The seventh embodiment of the present invention will be described below with reference to FIGS. 31A to 31E.

Figure 31A:
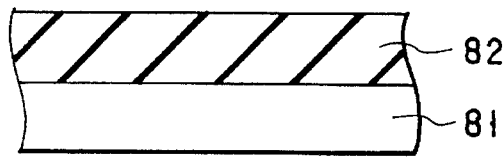
FIGS. 31A to 31E are sectional views sequentially showing the steps of a method of manufacturing a buried Cu wiring layer according to the seventh embodiment of the present invention.

As shown in FIG. 31A, an SiO$_2$ film 82 is formed on an Si substrate 81. In this case, although a simple two-layered structure is shown in FIG. 31A, a semiconductor element is formed under the SiO$_2$ film 82 in the actual processes in manufacturing a semiconductor device.

Figure 31D:
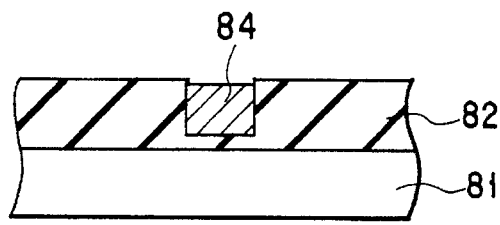
Figure 31B:
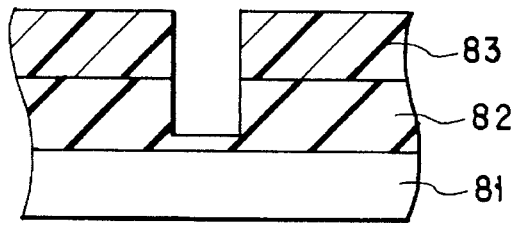

As shown in FIG. 31B, a resist film 83 is deposited and processed by the photographic process, and RIE for the SiO$_2$ film 82 is performed so as to form a groove having a depth of about 0.5 μm and a width of 0.3 μm. As shown in FIG. 31C, the resist film 83 is removed by the ashing process, and a Cu film containing 10% of Mg is formed on the entire surface of the resultant structure to have a thickness of 0.1 μm, thereby forming a Cu—Mg film 84.

When the resultant structure is annealed at 500° C. in an Ar atmosphere for 30 minutes, the Cu—Mg film 84 is fluidized and buries the groove which is formed in advance. If the Cu—Mg film is left on a portion except for the groove in this process, as shown in FIG. 31D, only the Cu—Mg film on this portion is removed.

Figure 31E:
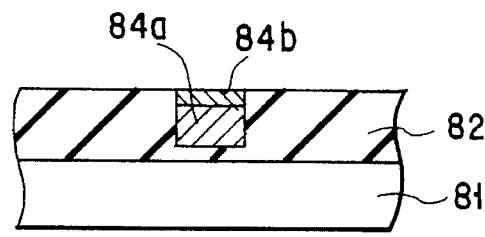
Figure 31C:
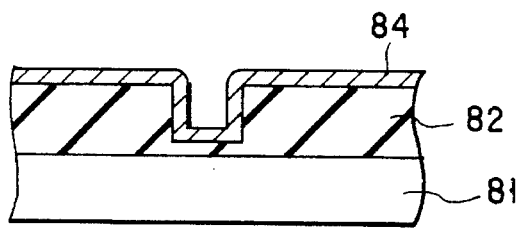

Thereafter, the resultant structure annealed at 600° C. in a nitrogen atmosphere for 30 minuets to cause only Mg in the Cu—Mg film 84 to react with nitrogen, and, as shown in FIG. 31E, an MgN$_x$ film 84b is formed on a Cu film 84a. Since this MgN$_x$ film is a conductor, the MgN$_x$ film 84b can be used as part of a wiring layer without any change. In addition, the MgN$_x$ film can be easily removed by processing using methyl alcohol.

Note that, when a second SiO$_2$ film is deposited on the structure obtained as described above, and the same method as described above is used, the second and third wiring layers can be formed. At this time, since the first wiring layer consists of pure copper having a high melting point, when the second and third wiring materials are fluidized without adversely affecting the first wiring layer.

Figure 32:
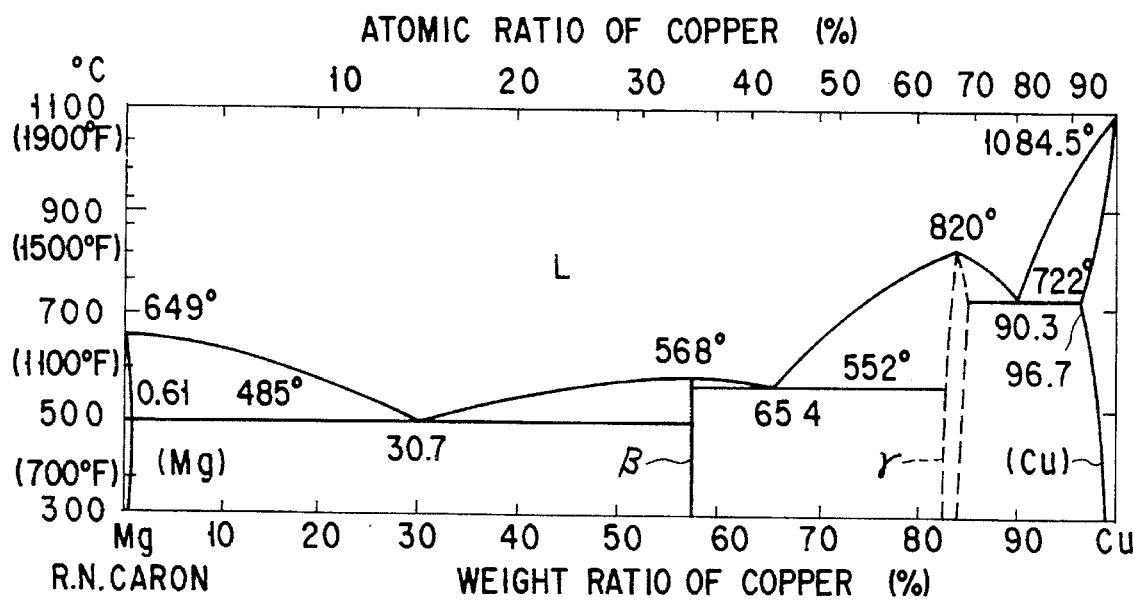
FIG. 32 is a graph showing the state of an alloy of Cu and Mg.

FIG. 32 is a graph showing the state of the Cu—Mg alloy described above. As is apparent from FIG. 32, in order to minimize an amount of Mg to be added, a melting point indicates a minimum temperature, i.e., 722° C., when 10% of Mg is added. That is, although 10% Mg is added to Cu in the above process, an amount of Mg is not limited to this value, and Mg whose amount is set to sufficiently decrease the melting point and obtained on the basis of the graph in FIG. 32 may be added to Cu.

In the above process, although the melting point of the Cu—Mg alloy is 722° C., a fluidizing point is set to be 500° C. A solid can be fluidized at a temperature lower than its melting point, and it is known that a solid is fluidized at a temperature corresponding to 70% to 80% of its melting point. In this embodiment, a fluidizing temperature is set to be 500° C.

In the process, Mg is precipitated in a nitrogen atmosphere. This phenomenon occurs due to the following relation. When the heat ($H_{Cu\text{-}MG}$) of a Cu—Mg alloy, the heat ($H_{Cu\text{-}N}$) of a Cu—N alloy, and the heat ($H_{Mg\text{-}N}$) of an Mg—N alloy have the relation shown in the following formula (1), and the difference between heat before annealing and heat after annealing is represented by the following equation (2), the following equation (3) representing the second law of thermodynamics is established.

$$|H_{Mg\text{-}N}| \geq |H_{Cu\text{-}Mg}|, |H_{Mg\text{-}N}| \geq |H_{Cu\text{-}N}| \tag{1}$$

$$\Delta H = H_{MG}(H_{Mg\text{-}N} - H_{Cu\text{-}Mg}) \tag{2}$$

NMg: the number of Mg atoms in unit volume $$\Delta G = \Delta H - T\Delta S < 0 \tag{3}$$

T: temperature

ΔS: entropy change amount

ΔG: Gibbs free energy change amount

That is, in this system, although the entropy change amount tends to decrease (ΔS<0) by gathering Mg atoms diffused in the Cu film at one position, the decrease in entropy change amount is compensated by ΔH, and ΔG is set to be negative. For this reason, the system tend to be stable.

Therefore, in the seventh embodiment, a combination between materials is not limited to the combination of Cu and Mg, and any combination between materials which satisfy the conditions described above can be used.

For example, the following combinations are considered: (Cu—Ge), (Cu—In), (Cu—Mg), (Cu—Mn), (Cu—Li), (Cu—Sb), (Cu—P), (Cu—Pn), (Cu—Sn), (Cu—Si), (Cu—Ti), (Cu—Y), (Ag—Al), (Au—Bi), (Au—Cu), (Au—Ge), (Au—In), (Au—Pb), (Au—Si), (Au—Sb), (Su—Sn), (Au—U), and the like.

The optimal values of the temperature of an additive, a fluidizing temperature, and the temperature of annealing in a nitrogen gas are changed depending on these combinations.

The eighth embodiment of the present invention will be described below with reference to FIGS. 33A to 33D.

Figure 33A:
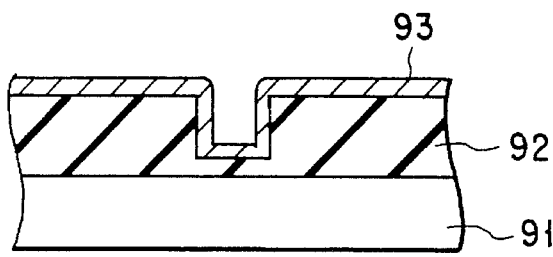
FIGS. 33A to 33D are sectional views sequentially showing the steps of a method of manufacturing a buried Ag wiring layer according to the eighth embodiment of the present invention.

As shown in FIG. 33A, an SiO$_2$ substrate 92 is formed on an Si substrate 91. A resist film is deposited and processed by the photolithographic process to form a resist pattern. The SiO$_2$ substrate 92 is etched by RIE using the resist pattern as a mask to form a groove having a depth of about 0.5 μm and a width of about 0.3 μm. Thereafter, the resist pattern is removed by the ashing process. An Ag—Mg film 93 is formed to have a thickness of about 0.1 μm.

Figure 33B:
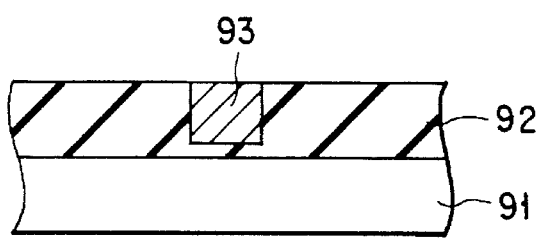
Figure 33C:
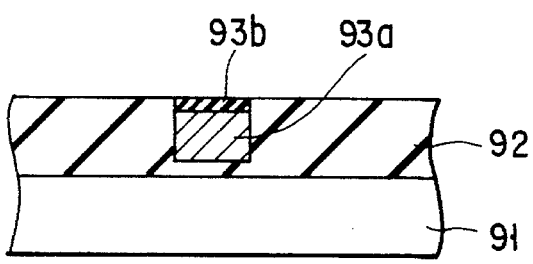
Figure 33D:
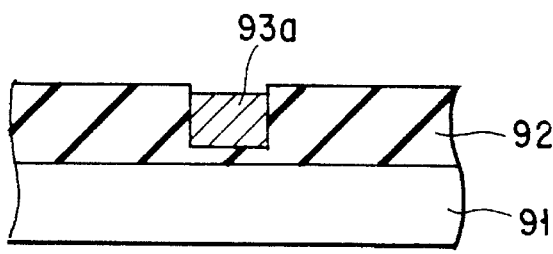

The resultant structure is annealed at 550° C. in an Ar gas for 30 minutes to fluidize the Ag—Mg film 93 as shown in FIG. 33B, thereby burying the groove with the Ag—Mg film. As shown in FIG. 33C, Mg in the Ag—Mg film is deposited as an MgO$_x$ film 93b by annealing in an oxygen gas. Although this MgO$_x$ film is an insulator, it can be easily removed. As shown in FIG. 33C, only an Ag film 93a can be left in the groove.

The MgO$_x$ film 93b is not necessarily removed, and it may be left. That is, when the Ag film 93a is connected to the second wiring layer, after a contact hole is formed in an insulating interlayer, only the MgO$_x$ film at the bottom portion of the contact hole may be removed.

In the process described above, a combination between materials is not limited to the combination of Ag and Mg, and all combinations of materials which have the relationship described in the first embodiment may be used.

For example, the following combinations are considered: (Ag—Pb), (Ag—Sb), (Ag—Sn), (Ag—Si), (Au—Zn), (Au—Al), (Au—Cd), (Au—Co), (Au—Cu), (Au—Ge), (Au—In), (Au—Pb), (Au—Si), (Au—Sb), (Au—Sn), (Ag—Zn), (Au—U), and the like.

Of course, the optimal values of the temperature of an additive, a fluidizing temperature, and the temperature of annealing in an oxygen gas are changed depending on these combinations.

Figure 34:
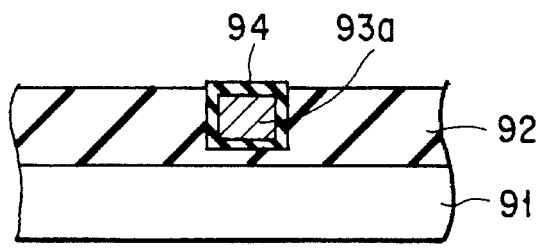
FIG. 34 is a sectional view showing a modification of the eighth embodiment of the present invention.

For example, when a combination (Ag—Sb) is selected, as shown in FIG. 34, the Ag film 93a can be entirely surrounded by an Sb$_2$O$_5$ film 94 according to the relationship between heat $|H_{SiO2}|$ and heat $|H_{Sb2O5}|$, i.e., $|H_{SiO2}|<|H_{Sb2O5}|$. According to this method, Sb is deposited in the four directions around the Sb$_2$O$_5$ film 94. Efficiency of removing an impurity according to the method is higher than that according to the method described above.

The ninth embodiment of the present invention will be described below.

In this embodiment, as in the seventh and eighth embodiments, a groove having the shape of a buried wiring layer is formed in an insulating film. In this case, however, Au containing 5% of Al is used as a material to be buried. The resultant structure is annealed at 400° C. in an Ar gas for 30 minutes to fluidize the material, thereby burying the groove with the material. Thereafter, the resultant structure is annealed at 300° C. in Cl$_2$ or BCl$_3$ atmosphere. At this time, Al in Au is diffused in Au to react with C on the Au surface, thereby producing AlCl$_3$. This material is vaporized and removed because the material has a high vapor pressure.

When this reaction progresses, Al in Au is entirely removed, and only pure Au is left in the groove. In this case, although a portion, having a thickness of about 200 Å, of the Au surface consists of AuCl$_x$, this rarely influences the resistance of the entire wiring layer. When only an AuCl$_x$ film on the bottom of a contact hole for connecting the first wiring layer to the second wiring layer is removed by reverse sputtering or the like, this embodiment can be applied to a multilayered wiring structure without any problem.

In this embodiment, although the combination (Au—Al) is exemplified, a combination between materials for the wiring layer is not limited to the combination (Au—Al), and a combination including a material such as a chloride having a high vapor pressure as an additive may be used. For example, a combination such as (Ag—Si), (Au—Si), (Cu—Ti), (Cu—Si), or the like is used.

In this embodiment, although only a Cl$_2$ or BCl$_3$ gas is supplied, annealing may be performed in the plasma of the Cl$_2$ or BCl$_3$ gas. In this case, a reaction temperature can be reduced to about 250° C. In addition, in the above embodiment, although a Cl-based gas is exemplified, any halogen gas which has an addition having a low vapor pressure and does not easily react with Au, Ag, and Cu can be used, and Br- or F-based gas may be used.

The tenth embodiment of the present invention will be described below with reference to FIGS. 35A and 35B.

Figure 35A:
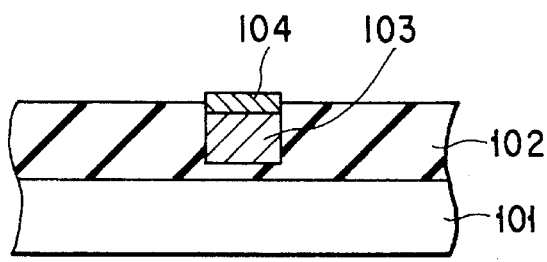
FIGS. 35A and 35B are sectional views sequentially showing the steps of a method of manufacturing a buried CU wiring layer according to the tenth embodiment of the present invention.

As shown in FIG. 35A, an SiO$_2$ film 102 is formed on an Si substrate 101, and a groove is formed in the SiO$_2$ film 102. A Cu film 103 containing 20% of Ti is deposited on the surface of the resultant structure to have a thickness of 0.1 μm. The resultant structure is annealed at 600° C. in an Ar gas for 30 minutes to fluidize the Cu film 103 containing Ti, thereby causing the Cu film 103 to flow into the groove. The resultant structure is annealed at 200° C. in an SiH$_4$ gas, and an Si layer 104 having a thickness of 0.2 μm is deposited on only the Cu film by thermal decomposition of SiH$_4$.

Figure 35B:
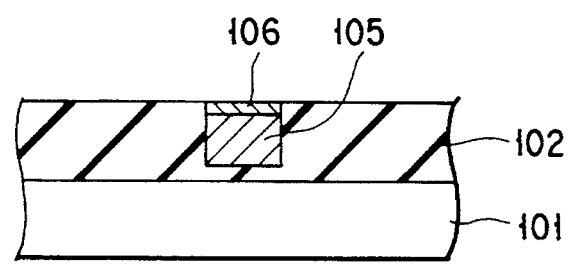

Thereafter, as shown in FIG. 35B, the resultant structure is annealed at 700° C. for 30 minutes in a nitrogen gas, an argon gas, or a vacuum state to cause Ti to react with Si in the Cu film, thereby forming a TiSi layer 106. A pure Cu film 105 is left in the groove. In this case, Si selectively reacts with Ti because heat produced by Si and Cu is higher than that by Si and T.

As a method of purifying Cu by reaction between Si and Ti, the method shown in FIGS. 36A to 36D is known.

AS shown in FIG. 36A, the SiO$_2$ film 102 is formed on the Si substrate 101, and a groove is formed in the SiO$_2$ film 102. The Si layer 104 is deposited on only the bottom portion of the groove. Any method of forming the Si layer 104 is used. Ion-implantation of Si is performed in the groove at, e.g., 30 keV and 1×10$^{16}$ cm$^2$, immediately after the groove is formed by, e.g., RIE, the bottom portion of the groove is set in a rich amorphous state, and then the resist film is removed. In this state, when Si in the SiH$_4$ is selectively deposited, the Si layer 104 having a thickness of 0.2 μm is formed on only the bottom of the groove.

As shown in FIG. 36B, the Cu film 103 containing 20% of Ti is deposited on the entire surface of the Si layer 104 to have a thickness of 0.1 μm. As shown in FIG. 36C, the resultant structure is annealed at 600° C. in an Ar gas for 30 minutes to fluidize the Cu film 103, thereby causing the Cu film 103 to flow into the groove.

In this case, although Ti in the Cu film begins to react with Si, a large amount of Ti is present in the Cu film because the temperature of the Cu film is not sufficiently high. At this time, when the resultant structure is annealed at 700° C. for 30 minutes in an inert gas, a nitrogen gas, or a vacuum state, as shown in FIG. 36D, Ti is completely changed into the TiSi layer 106 and separated from the pure Cu film 105.

A method used in place of the process as described above will be described below with reference to FIGS. 37A to 37D.

As shown in FIG. 37A, a Cu film containing 10% of Si is formed on the entire surface of the SiO$_2$ film 102 in which a groove is formed, and this film is fluidized by annealing at 650° C. in an Ar gas for 30 minutes to flow into the groove. As shown in FIG. 37B, a Ti film 108 is deposited on the entire surface of the resultant structure and annealed at 700° C. in an N$_2$ atmosphere for 30 minutes, and as shown in FIG. 37C, a TiSi$_2$ film 110 is formed between a Cu film 109 and an TiN film 111. At this time, Si in the Cu film is precipitated in the form of a silicide.

Thereafter, as shown in FIG. 37D, the TiN film 111 is removed by annealing using a solution containing H$_2$O$_2$.

In each of the seventh to tenth embodiments described above, although annealing for fluidization is performed in an Ar gas, this annealing may be performed in any atmosphere which does not react with a wiring material or an additive. An inert gas atmosphere, a vacuum atmosphere, or an atmosphere obtained by mixing hydrogen to any one of these atmospheres is preferably used. During annealing for fluidization, hydrogen can remove carbon or oxygen adhered to the surface or grain boundaries of a mixture to be fluidized after or while the mixture is deposited. For this reason, hydrogen can enhance fluidization.

In addition, although the annealing for fluidization is performed after a wiring material is deposited, the wiring material may be fluidized by simultaneously performing annealing and deposition. In each of the seventh to tenth embodiments, a material having good wetting properties with Au, Ag, Cu, and additives for these materials can be formed on the bottom and side surfaces of a groove in advance before a mixture of wiring materials is deposited. For example, a TiN layer is formed in the groove of the $SiO_2$ film to improve the wetting properties in the groove better than those of other portions, so that fluidization of Cu—Mg may be enhanced.

As described above, when a method of forming a metal wiring layer using a burying method and selective growth according to the present invention is used, complication of processes caused by micropatterning a wiring layer can be avoided, and a metal wiring layer having an excellent shape can be obtained.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a first metal film containing a first metal element on a semiconductor substrate;

forming a second metal film consisting essentially of silver or containing silver as a main component on said first metal film; and performing annealing in an atmosphere containing a second element to diffuse the first metal element in said first metal film into the surface of said second metal film so as to form a third film containing the second element and the first metal element on the surface of the second metal film.

2. A method according to claim 1, wherein the first metal element is one selected from the group consisting of Ti, Si, In, Nb, Pb, Sb, Sn, Mg, Al, Cr, Be, Zn, and alloy thereof.

3. A method according to claim 1, wherein the second element is one selected from the group consisting of oxygen and nitrogen.

4. A method according to claim 1, wherein the annealing is performed at a temperature ranging from 450° C. to 750° C.

5. A method according to claim 1, wherein the first metal element is Ti, the second element is oxygen, and said third film consists essentially of titanium oxide.

* * * * *